(12) United States Patent
Amundson et al.

(10) Patent No.: US 7,442,587 B2
(45) Date of Patent: Oct. 28, 2008

(54) PROCESSES FOR FORMING BACKPLANES FOR ELECTRO-OPTIC DISPLAYS

(75) Inventors: Karl R. Amundson, Cambridge, MA (US); Guy M. Danner, Somerville, MA (US); Gregg M. Duthaler, Needham, MA (US); Peter T. Kazlas, Sudbury, MA (US); Yu Chen, Milpitas, CA (US); Kevin L. Denis, Bowie, MD (US); Nathan R. Kane, Arlington, MA (US); Andrew P. Ritenour, Arlington, MA (US)

(73) Assignee: E Ink Corporation, Cambridge, MA (US)

( * ) Notice: Subject to any disclaimer, the term of this patent is extended or adjusted under 35 U.S.C. 154(b) by 260 days.

(21) Appl. No.: 11/424,258

(22) Filed: Jun. 15, 2006

(65) Prior Publication Data

US 2006/0223282 A1 Oct. 5, 2006

Related U.S. Application Data

(62) Division of application No. 10/249,624, filed on Apr. 24, 2003, now Pat. No. 7,223,672.

(60) Provisional application No. 60/376,603, filed on Apr. 30, 2002, provisional application No. 60/375,246, filed on Apr. 24, 2002

(51) Int. Cl.
*H01L 21/00* (2006.01)

(52) U.S. Cl. .................. 438/149; 257/59; 257/E21.094; 257/E21.104

(58) Field of Classification Search .................. 438/149, 438/156, 164; 257/59, 72
See application file for complete search history.

(56) References Cited

U.S. PATENT DOCUMENTS 3,668,106 A    6/1972 Ota (Continued)

FOREIGN PATENT DOCUMENTS

JP    01-142537 A    6/1989

(Continued)

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

(Continued)

*Primary Examiner*—Quoc D Hoang
(74) *Attorney, Agent, or Firm*—David J. Cole

(57) ABSTRACT

A non-linear element is formed on a flexible substrate by securing the substrate to a rigid carrier, forming the non-linear element, and then separating the flexible substrate from the carrier. The process allows flexible substrates to be processed in a conventional fab intended to process rigid substrates. In a second method, a transistor is formed on a insulating substrate by forming gate electrodes, depositing a dielectric layer, a semiconductor layer and a conductive layer, patterning the conductive layer to form source, drain and pixel electrodes, covering the channel region of the resultant transistor with an etch-resistant material and etching using the etch-resistant material and the conductive layer as a mask, the etching extending substantially through the semiconductor layer between adjacent transistors. The invention also provides a process for forming a diode on a substrate by depositing on the substrate a first conductive layer, and a second patterned conductive layer and a patterned dielectric layer over parts of the first conductive layer, and etching the first conductive layer using the second conductive layer and dielectric layer as an etch mask. Finally, the invention provides a process for driving an impulse-sensitive electro-optic display.

18 Claims, 19 Drawing Sheets

U.S. PATENT DOCUMENTS

| | | |
|---|---|---|
| 3,756,693 A | 9/1973 | Ota |
| 3,767,392 A | 10/1973 | Ota |
| 3,792,308 A | 2/1974 | Ota |
| 3,870,517 A | 3/1975 | Ota et al. |
| 3,892,568 A | 7/1975 | Ota |
| 4,810,637 A | 3/1989 | Szydlo et al. |
| 5,175,047 A | 12/1992 | McKenney et al. |
| 5,234,541 A | 8/1993 | Shannon et al. |
| 5,238,861 A | 8/1993 | Morin et al. |
| 5,362,671 A | 11/1994 | Zavracky et al. |
| 5,414,283 A | 5/1995 | den Boer et al. |
| 5,569,610 A | 10/1996 | Zhang et al. |
| 5,641,974 A | 6/1997 | den Boer et al. |
| 5,715,026 A | 2/1998 | Shannon |
| 5,757,453 A * | 5/1998 | Shin et al. ................... 349/122 |
| 5,760,761 A | 6/1998 | Sheridon |
| 5,777,782 A | 7/1998 | Sheridon |
| 5,808,783 A | 9/1998 | Crowley |
| 5,824,186 A | 10/1998 | Smith et al. |
| 5,847,413 A | 12/1998 | Yamazaki et al. |
| 5,904,545 A | 5/1999 | Smith et al. |
| 5,917,564 A * | 6/1999 | Kim et al. ..................... 349/46 |
| 5,930,026 A | 7/1999 | Jacobson et al. |
| 5,961,804 A | 10/1999 | Jacobson et al. |
| 6,017,584 A | 1/2000 | Albert et al. |
| 6,027,958 A | 2/2000 | Vu et al. |
| 6,054,071 A | 4/2000 | Mikkelsen, Jr. |
| 6,055,091 A | 4/2000 | Sheridon et al. |
| 6,067,185 A | 5/2000 | Albert et al. |
| 6,097,531 A | 8/2000 | Sheridon |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,127,199 A | 10/2000 | Inoue et al. |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,147,791 A | 11/2000 | Sheridon |
| 6,150,668 A | 11/2000 | Bao et al. |
| 6,172,878 B1 | 1/2001 | Takabayashi et al. |
| 6,177,921 B1 | 1/2001 | Comiskey et al. |
| 6,232,950 B1 | 5/2001 | Albert et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,274,412 B1 | 8/2001 | Kydd et al. |
| 6,300,932 B1 | 10/2001 | Albert |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,323,989 B1 | 11/2001 | Jacobson et al. |
| 6,327,072 B1 | 12/2001 | Comiskey et al. |
| 6,376,828 B1 | 4/2002 | Comiskey |
| 6,377,387 B1 | 4/2002 | Duthaler et al. |
| 6,392,786 B1 | 5/2002 | Albert |
| 6,413,790 B1 | 7/2002 | Duthaler et al. |
| 6,445,489 B1 | 9/2002 | Jacobson et al. |
| 6,454,918 B1 | 9/2002 | Sakaki |
| 6,458,234 B1 | 10/2002 | Lake et al. |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,515,649 B1 | 2/2003 | Albert et al. |
| 6,518,949 B2 | 2/2003 | Drzaic |
| 6,525,865 B2 | 2/2003 | Katase |
| 6,531,997 B1 | 3/2003 | Gates et al. |
| 6,535,197 B1 | 3/2003 | Comiskey et al. |
| 6,538,801 B2 | 3/2003 | Jacobson et al. |
| 6,545,291 B1 | 4/2003 | Amundson et al. |
| 6,580,545 B2 | 6/2003 | Morrison et al. |
| 6,639,578 B1 | 10/2003 | Comiskey et al. |
| 6,657,772 B2 | 12/2003 | Loxley |
| 6,664,944 B1 | 12/2003 | Albert et al. |
| D485,294 S | 1/2004 | Albert |
| 6,683,333 B2 | 1/2004 | Kazlas et al. |
| 6,693,620 B1 | 2/2004 | Herb et al. |
| 6,704,133 B2 | 3/2004 | Gates et al. |
| 6,721,083 B2 | 4/2004 | Jacobson et al. |
| 6,724,519 B1 | 4/2004 | Morrison et al. |
| 6,727,881 B1 | 4/2004 | Albert et al. |
| 2001/0045934 A1 | 11/2001 | Turner et al. |
| 2002/0019081 A1 | 2/2002 | Denis et al. |
| 2002/0021270 A1 | 2/2002 | Albert |
| 2002/0060321 A1 | 5/2002 | Kazlas et al. |
| 2002/0063661 A1 | 5/2002 | Comiskey et al. |
| 2002/0075556 A1 | 6/2002 | Liang et al. |
| 2002/0090980 A1 | 7/2002 | Wilcox et al. |
| 2002/0113770 A1 | 8/2002 | Jacobson et al. |
| 2002/0130832 A1 | 9/2002 | Baucom et al. |
| 2002/0131147 A1 | 9/2002 | Paolini, Jr. et al. |
| 2002/0171910 A1 | 11/2002 | Pullen et al. |
| 2002/0180687 A1 | 12/2002 | Webber |
| 2002/0180688 A1 | 12/2002 | Drzaic et al. |
| 2002/0185378 A1 | 12/2002 | Honeyman et al. |
| 2003/0011560 A1 | 1/2003 | Albert et al. |
| 2003/0011868 A1 | 1/2003 | Zehner et al. |
| 2003/0020844 A1 | 1/2003 | Albert et al. |
| 2003/0025855 A1 | 2/2003 | Holman et al. |
| 2003/0038755 A1 | 2/2003 | Amundson et al. |
| 2003/0053189 A1 | 3/2003 | Goenaga et al. |
| 2003/0102858 A1 | 6/2003 | Jacobson et al. |
| 2003/0132908 A1 | 7/2003 | Herb et al. |
| 2003/0137521 A1 | 7/2003 | Zehner et al. |
| 2003/0137717 A1 | 7/2003 | Albert et al. |
| 2003/0151702 A1 | 8/2003 | Morrison et al. |
| 2003/0214695 A1 | 11/2003 | Abramson et al. |
| 2003/0214697 A1 | 11/2003 | Duthaler et al. |
| 2003/0222315 A1 | 12/2003 | Amundson et al. |

FOREIGN PATENT DOCUMENTS

| | | |
|---|---|---|
| JP | 02-223934 A | 9/1990 |
| JP | 02-223935 A | 9/1990 |
| JP | 02-223936 A | 9/1990 |
| JP | 02-284124 A | 11/1990 |
| JP | 02-284125 A | 11/1990 |
| JP | 2002-072258 | 3/2002 |
| WO | WO 99/67678 | 12/1999 |
| WO | WO 00/05704 | 2/2000 |
| WO | WO 00/26761 | 5/2000 |
| WO | WO 00/36560 | 6/2000 |
| WO | WO 00/38000 | 6/2000 |
| WO | WO 00/67110 | 11/2000 |
| WO | WO 00/67327 | 11/2000 |
| WO | WO 01/07961 | 2/2001 |
| WO | WO 01/08241 | 2/2001 |
| WO | WO 01/27690 | 4/2001 |
| WO | WO 02/01281 | 1/2002 |

OTHER PUBLICATIONS

Bach, U., et al., "Nanomaterials-Based Electrochomics for Paper-Quality Displays", Adv. Mater, 14(11), 845 (2002).

Chen, Y., et al., "A Conformable Electronic Ink Display using a Foil-Based a-Si TFT Array", SID 01 Digest, 157 (Jun. 2001).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Drzaic, P., et al., "A Printed and Rollable Bistable Electronic Display", SID 98 Digest (1998), p. 1131.

Jacobson, J., et al., "The last book", IBM Systems J., 36, 457 (1997).

Kazlas, P., et al., "12.1" SVGA Microencapsulated Electrophoretic Active Matrix Display for Information Applicances, SID 01 Digest, 152 (Jun. 2001).

Pitt, M.G., et al., "Power Consumption of Microencapsulated Electrophoretic Displays for Smart Handheld Applications", SID 02 digest, 1378 (2002).

Webber, R., "Image Stability in Active-Matrix Microencapsulated Electrophoretic Displays", SID 02 Digest, 126 (2002).

Wood, D., "An Electrochromic Renaissance?" Information Display, 18(3), 24 (Mar. 2002).

* cited by examiner

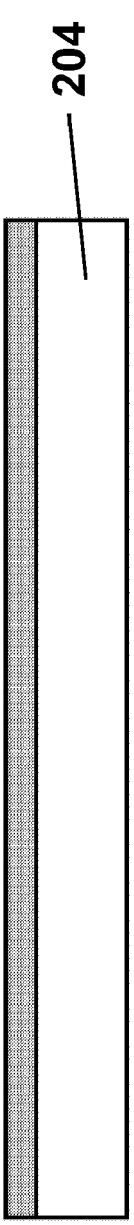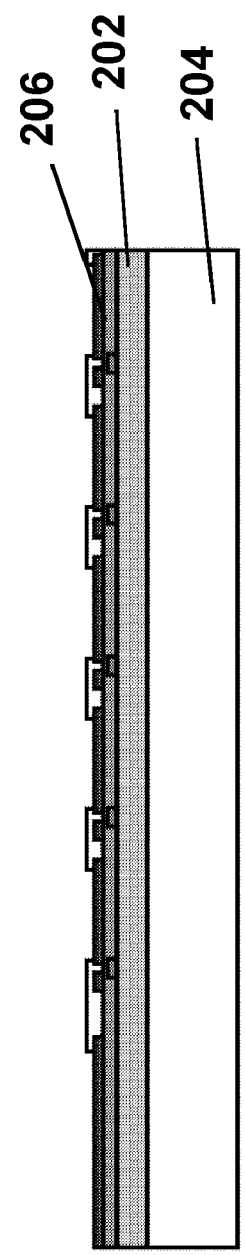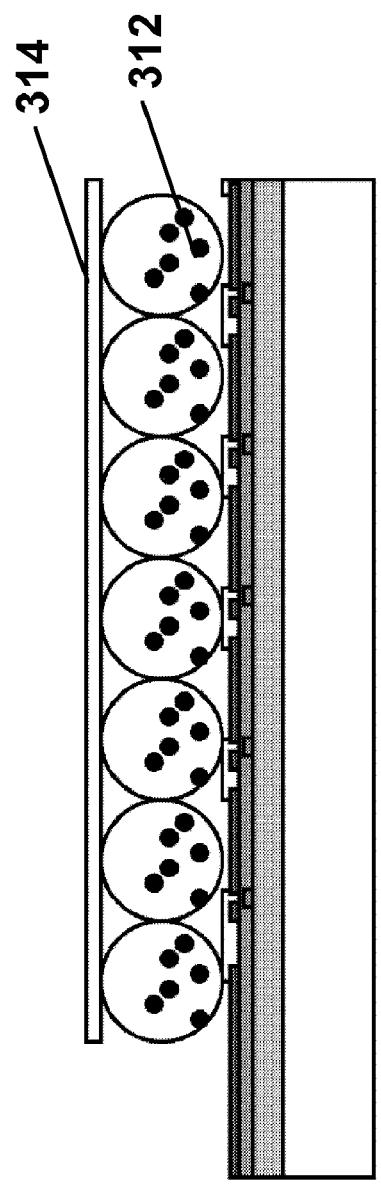

US 7,442,587 B2

PROCESSES FOR FORMING BACKPLANES FOR ELECTRO-OPTIC DISPLAYS

CROSS REFERENCE TO RELATED APPLICATIONS

This application is a divisional of copending application Ser. No. 10/249,624, filed Apr. 24, 2003 (Publication No. 2004/0014265), which claims priority from application Ser. No. 60/375,246, filed Apr. 24, 2002 and application Ser. No. 60/376,603, filed Apr. 30, 2002.

This application is also related to application Ser. No. 09/565,413, filed May 5, 2000 (now U.S. Pat. No. 7,030,412); application Ser. No. 09/904,109, filed Jul. 12, 2001 (now U.S. Pat. No. 6,683,333); copending application Ser. No. 09/904,435, filed Jul. 12, 2001 (Publication No. 2002/0060321), and application Ser. No. 10/065,795, filed Nov. 20, 2002 (now U.S. Pat. No. 7,012,600). This application is also related to copending application Ser. No. 10/249,618, filed Apr. 24, 2003 (Publication No. 2003/0222315). The entire contents of the aforementioned applications are herein incorporated by reference. The entire contents of all United States patents and published Applications mentioned below are also herein incorporated by reference.

BACKGROUND OF INVENTION

The present invention relates to processes for forming backplanes for electro-optic (electronic) displays. This invention also relates to certain improvements in non-linear devices for use in such backplanes and to processes for forming such non-linear devices.

The term "electro-optic" as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published U.S. Patent Application No. 2002/0180687 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed to applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. No. 6,301,038, International Application Publication No. WO 01/27690, and in application Ser. No. 10/249,128, filed Mar. 18, 2003 (now U.S. Pat. No. 6,950,220). This type of medium is also typically bistable.

Another type of electro-optic display, which has been the subject of intense research and development for a number of years, is the particle-based electrophoretic display, in which a plurality of charged particles move through a suspending fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; and 6,545,291; and U.S. Patent Applications Publication Nos. 2002/0019081; 2002/0021270; 2002/0053900; 2002/0060321; 2002/0063661; 2002/0063677; 2002/0090980; 2002/0106847; 2002/0113770; 2002/0130832; 2002/0131147; 2002/0145792; 2002/0154382; 2002/0171910; 2002/0180687; 2002/0180688; 2002/0185378; 2003/

0011560; 2003/0011867; 2003/0011868; 2003/0020844; 2003/0025855; 2003/0034949; 2003/0038755; and 2003/0053189; and International Applications Publication Nos. WO 99/67678; WO 00/05704; WO 00/20922; WO 00/26761; WO 00/38000; WO 00/38001; WO 00/36560; WO 00/67110; WO 00/67327; WO 01/07961; and WO 01/08241.

Many of the aforementioned patents and applications recognize that the walls surrounding the discrete microcapsules in an encapsulated electrophoretic medium could be replaced by a continuous phase, thus producing a so-called polymer-dispersed electrophoretic display in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; and other similar techniques.) Thus, the resulting display can be flexible. Further, because the display medium can be printed (using a variety of methods), the display itself can be made inexpensively.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Applications Publication No. WO 02/01281, and published US Application No. 2002/0075556, both assigned to Sipix Imaging, Inc.

The aforementioned types of electro-optic displays are bistable and are typically used in a reflective mode, although as described in certain of the aforementioned patents and applications, such displays may be operated in a "shutter mode" in which the electro-optic medium is used to modulate the transmission of light, so that the display operates in a transmissive mode. Liquid crystals, including polymer-dispersed liquid crystals, are, of course, also electro-optic media, but are typically not bistable and operate in a transmissive mode. The backplanes of the present invention may be used with both reflective and transmissive displays, including conventional liquid crystal displays.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element is associated with each pixel, to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner. Thus, in a display with N rows, any given pixel can only be addressed for a fraction 1/N of the time.

Processes for manufacturing active matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Liquid crystal displays commonly employ amorphous silicon ("a-Si"), thin-film transistors ("TFT's") as switching devices for display pixels. Such TFT's typically have a bottom-gate configuration. Within one pixel, a thin-film capacitor typically holds a charge transferred by the switching TFT. Electrophoretic displays can use similar TFT's with capacitors, although the function of the capacitors differs somewhat from those in liquid crystal displays; see the aforementioned copending application Ser. No. 09/565,413, and Publications 2002/0106847 and 2002/0060321. Thin-film transistors can be fabricated to provide high performance. Fabrication processes, however, can result in significant cost.

In TFT addressing arrays, pixel electrodes are charged via the TFT's during a line address time. During the line address time, a TFT is switched to a conducting state by changing an applied gate voltage. For example, for an n-type TFT, a gate voltage is switched to a "high" state to switch the TFT into a conducting state.

Many electro-optic materials require application of a drive voltage for a significant switching time (typically of the order of $10^{-2}$ to $10^{-1}$ seconds) to effect a transition between their two extreme optical states. For high resolution displays containing at least (say) 100 rows and columns, if a reasonable scan rate is to be maintained, the period for which an individual pixel is addressed during a single scan is much less than the switching time of the electro-optic medium, and accordingly much of the switching of a pixel is effected by the voltage which remains on the pixel electrode between successive times of addressing the pixel (i.e., while other rows of the display are being addressed). This remaining voltage gradually decays due to current passing through the electro-optic material of the pixel and any current leakage through the non-linear element. The rate at which this decay occurs can be reduced (and the average voltage applied to the pixel during one complete scan of the display thus increased—this is commonly referred to as "increasing the voltage holding capacity" of the pixel) by connecting the pixel electrode to a capacitor.

At least some of the aforementioned electro-optic media can be made sufficiently flexible to permit their use in flexible displays based upon flexible substrates such as metal or polymeric films. However, manufacturing flexible microelectronic backplanes for such displays presents many challenges. Flexible substrates such as the polyimide-over-steel substrates described in the aforementioned 2002/0019081 will likely require specialized tooling for substrate handling. This is problematic for two reasons. Firstly, the required tooling does not exist. Secondly, a substantial investment by an existing display manufacturer will be required. This investment includes taking an existing glass-fab off-line, retrofitting the equipment, bringing the fab back on-line, and climbing the yield curve again. After retrofitting a fab for flexible substrates, it may not be possible to simultaneously process glass substrates due to the differences in the fixtures required. Thick steel substrates may not require as much specialized tooling for handling; however, display manufacturers may still be hesitant to process steel substrates due to contamination concerns and other issues. In any case, display manufacturers may be unwilling to make the required investment during the early stages of flexible display development.

In one aspect, the present invention allows a flexible display to be manufactured in an existing glass fab with virtually no changes to the facility. The fab could stay on-line and would be able to simultaneously produce flexible and glass backplanes. The invention provides a process in which a microelectronic display is fabricated on a rigid carrier and then released to produce a flexible display.

In another aspect, this invention seeks to reduce one major factor in the cost of preparing active matrix backplanes for electro-optic displays, namely the patterning steps; the present invention seeks to reduce the number of patterning steps needed.

In another aspect, this invention seeks to reduce the cost of diode backplane by replacing photolithography steps with printing.

Finally, this invention relates to improvements in drivers for electro-optic displays using an impulse sensitive electro-optic medium.

SUMMARY OF INVENTION

Accordingly, in one aspect this invention provides a process for forming at least one non-linear element on a flexible substrate. This process comprises:
  securing a flexible substrate on a substantially rigid carrier;
  forming at least one non-linear element on the flexible substrate while is flexible substrate is secured to the substantially rigid carrier; and
  separating the flexible substrate and the at least one non-linear element from the substantially rigid carrier.

This process of the invention may hereinafter for convenience be called the "rigid carrier" process.

In this rigid carrier process, the flexible substrate may comprise a polyimide layer. The flexible substrate may also comprise any one or more of a moisture barrier layer, a reflective layer, a release layer and a dielectric capping layer. The reflective layer may comprises a polymeric material having reflective metal particles dispersed therein.

In one form of the rigid carrier process, the rigid carrier transmits at least one wavelength of electromagnetic radiation, and the formation of the at least one non-linear element comprises at least one step in which electromagnetic radiation is transmitted through the substantially rigid carrier. The rigid carrier may, for example be formed at least in part of glass.

The rigid carrier process is especially useful for forming backplanes for electro-optic displays, i.e., in the rigid carrier process, the at least one non-linear element may comprise at least one backplane for an electro-optic display, and conveniently a plurality of discrete backplanes for electro-optic displays. Following formation of such a plurality of backplanes, both the flexible substrate and the substantially rigid carrier may be separated into a plurality of separate sections, each comprising one backplane, and thereafter in each of the separate sections, the substantially rigid carrier separated from the flexible substrate and the backplane. After the formation of the plurality of separate sections, but before separation of the substantially rigid carrier from the flexible substrate in each section, each section may be subjected to attachment of an electrical connector to the backplane and/or deposition of an electro-optic medium on the backplane. Separation of the substantially rigid carrier from the backplane is conveniently effected by radiation ablation of an ablatable layer disposed between the substantially rigid carrier and the backplane. A supporting layer may be attached to the flexible substrate after separation of the flexible substrate from the substantially rigid carrier.

Alternatively, after formation of a plurality of backplanes, the flexible substrate may be separated from the substantially rigid carrier, and thereafter the flexible substrate separated into a plurality of separate sections, each comprising one backplane. In such a process, after separation of the substantially rigid carrier from the flexible substrate but before separation of the flexible substrate into the sections, the flexible substrate may have an electrical connector to each of the backplanes, and/or an electro-optic medium may be deposited on the backplanes. Again, separation of the substantially rigid carrier from the backplane is conveniently effected by radiation ablation of an ablatable layer disposed between the substantially rigid carrier and the backplane, and a supporting layer may be attached to the flexible substrate after separation of the flexible substrate from the substantially rigid carrier.

In another variant of the rigid carrier process, following formation of the plurality of backplanes, a transfer substrate may be secured to the exposed surface of the flexible substrate carrying the backplanes, and thereafter the flexible substrate separated from the substantially rigid carrier. Again separation of the substantially rigid carrier from the flexible substrate is conveniently effected by radiation ablation of an ablatable layer disposed between the substantially rigid carrier and the backplane, and the flexible substrate may be separated into a plurality of sections each comprising one backplane, after separation of the substantially rigid carrier from the flexible substrate. The transfer substrate may be removed from the flexible substrate prior to separation of the flexible substrate into the sections.

In all variants of the rigid transfer process, it is generally desirable that the substantially rigid carrier have a coefficient of thermal expansion which is at least as great as the coefficient of thermal expansion of the flexible substrate.

The flexible substrate may be attached to the substantially rigid carrier in various ways. For example, one of the substantially rigid carrier and the flexible substrate may be provided with a plurality of projections and the other of the substantially rigid carrier and the flexible substrate provided with a plurality of aperture or recesses arranged to receive the projections, the flexible substrate being secured to the substantially rigid carrier by inserting the projections into the apertures or recesses. Alternatively, the flexible substrate may be secured to the substantially rigid carrier by spot welding, or magnetically.

In other aspect, this invention provides a method for forming a transistor array on a insulating substrate. This method comprises, in order:

forming a plurality of gate electrodes on the substrate;
depositing over said gate electrodes a dielectric layer, a semiconductor layer and a conductive layer;
patterning said conductive layer to form adjacent each gate electrode a source and drain electrode pair separated by a channel region, said patterning also forming a pixel electrode for each source and drain electrode pair, said pixel electrode being electrically connected to one of the source and drain electrodes;
covering said channel region of each transistor with an etch-resistant material; and
etching the resultant structure using the etch-resistant material and the exposed portions of the conductive layer as a mask, said etching extending substantially through the semiconductor layer between adjacent transistors.

This invention extends to a transistor array produced by this method, and to an electro-optic display comprising such a transistor array in combination with a plurality of pixel electrodes each of which is connected to one of the source and drain electrodes of one transistor of the array, an electro-optic medium disposed adjacent the pixel electrodes and at least one electrode on the opposed side of the electro-optic medium from the pixel electrodes.

In another aspect, this invention provides a process for forming a diode on a substrate, the process comprising:

depositing a first conductive layer on the substrate;
depositing a second patterned conductive layer over part of the first conductive layer;
depositing a patterned dielectric layer over part of the first conductive layer; and
etching the first conductive layer using the second patterned conductive layer and the dielectric layer as an etch mask, thereby forming at least one diode on the substrate.

Finally, this invention provides, in a process for driving an impulse-sensitive electro-optic display, which comprises applying to each of the pixels of the display a voltage selected from within a voltage range for a time selected within a time range, the improvement which comprises providing an additional voltage spaced from said voltage range, and applying the additional voltage to at least one pixel of the display for a time within the time range.

BRIEF DESCRIPTION OF DRAWINGS

Preferred embodiments of the present invention will now be described, though by way of illustration only, with reference to the accompanying drawings, in which:

FIGS. 2A-2E, 3A-3F and 4A-4F are schematic side elevations at various stages of three preferred rigid carrier processes of the present invention;

DETAILED DESCRIPTION

Figure 1:
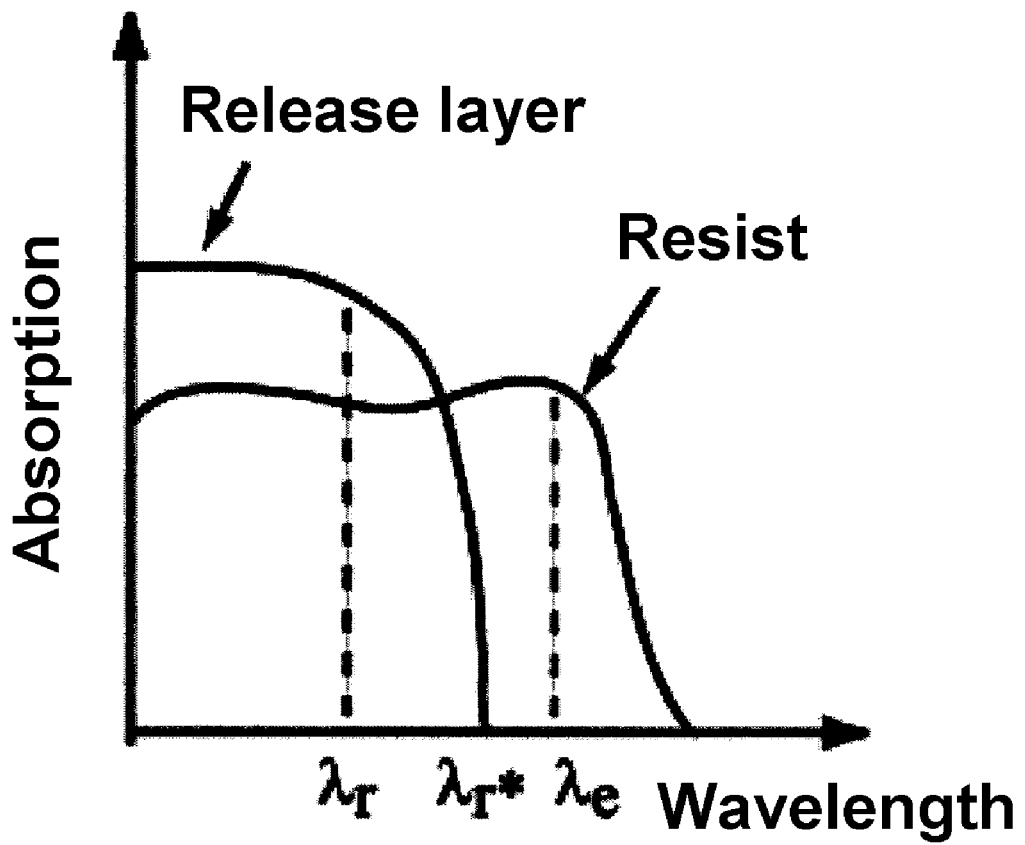
FIG. 1 is a graph showing the variation with wavelength of a film stack and resist useful in a rigid carrier process of the present invention.

In the following detailed description, rigid carrier processes of the invention will first be described with reference to FIGS. 1-10B. Next, processes for the formation of transistors by processes of the invention will be described with reference to FIGS. 11-17. Processes of the invention for the formation of diodes and diode arrays will then be described with reference to FIGS. 18A-21. Finally, methods of the present invention for driving electro-optic displays will be described.

Rigid Carrier Processes

As already mentioned this invention provides a rigid carrier process for forming a non-linear element, which may be a diode or a transistor, on a flexible substrate. The flexible substrate is secured to a substantially rigid carrier, at least one non-linear element is formed on the flexible substrate, and then the flexible substrate and the at least one non-linear element are separated from the substantially rigid carrier.

In the rigid carrier process of the present invention, the basic process flow is as follows. The first step is to provide the flexible substrate on the rigid carrier; this carrier is preferably formed of display grade glass. The flexible substrate may be a pre-formed substrate, or may be formed in situ by coating a substrate-forming material on to the carrier. For example, the flexible substrate may be formed by coating a thick layer of polyimide on to a carrier. The flexible substrate may consist of only a single layer (typically a layer of polymer having sufficient mechanical integrity) or may comprise multiple layers (films) that serve different functions. For example, a moisture barrier film may be included in the substrate to prevent moisture absorption after the substrate and the non-linear elements have been separated from the carrier. Alternatively or in addition, a reflective layer, such as a sputtered or evaporated thin metallic film, may be included to block UV or other electromagnetic radiation.

As already indicated, in some cases the flexible substrate may include a ablatable or other type of release layer. A simple polyimide or other polymeric layer may itself act as a release layer. However, in many cases it may be desirable to include a release layer separate from the polymeric or other layer which provides the basic mechanical integrity of the flexible substrate. For example, a release layer may be formed of amorphous silicon, in which case the amorphous silicon release layer is preferably disposed adjacent the carrier when the flexible substrate is secured to the carrier. Alternatively, a polymeric film with UV (or other electromagnetic radiation) reflecting or absorbing particles may be used as the release layer.

Thus, a wide range of structures are possible in the flexible substrate used in the present invention. Examples of such structures include (giving the layers in order, with the layer closest to the substantially rigid carrier first):

(a) a single polymeric layer, typically of polyimide;
(b) a polymeric release layer, typically of polyimide, a reflective layer (which may also serve as a moisture barrier) and a main polymeric layer (the reflective layer under the main polymeric layer prevents moisture absorption after the carrier is separated from the flexible substrate);
(c) an amorphous silicon release layer, a reflective layer (which may also serve as a moisture barrier) and a main polymeric layer; and
(d) a polymeric layer comprising a polymer, typically polyimide, containing reflective metal particles, and a main polymeric layer.

Any of these structures may have a dielectric capping layer on top of the main polymeric layer to prevent moisture and solvent absorption during the fabrication of the non-linear elements and/or to prevent out-gassing during vacuum deposition steps. One suitable capping layer comprises 100-500 nm of silicon nitride deposited, for example by PECVD.

Polymers other than polyimide may of course be used in this process, but the polymer should be able to withstand the temperatures used in fabrication of non-linear elements (such as thin film transistors, "TFT's), which are typically about 150-350° C., and should also be compatible with the process employed to release the flexible substrate from the substantially rigid carrier. One example of a suitable non-polyimide material is benzocyclobutene, sold by Dow Chemical Company, Wilmington Del., under the Registered Trademark CYCLOTENE.

As already indicated many TFT and other non-linear element manufacturing processes use backside resist exposure (i.e., exposure of a photoresist layer through the substrate) to form self-aligned structures. Thus, in many rigid carrier processes of the present invention it may be desirable to use a polymeric film that will allow a backside exposure step to be used. The flexible substrate should be optimized to allows radiation to pass therethrough the layers and expose photoresist coated thereon. If, as is generally preferred, the flexible substrate is to be released from the rigid carrier by a radiation-induced release process, a backside exposure step requires that the layer which acts as the release layer of the flexible substrate absorb radiation at the wavelength ($\lambda_r$) used in the release step, but that both this release layer and the other layers of the flexible substrate transmit radiation at the exposure wavelength ($\lambda_e$) used in the backside exposure step, as illustrated in FIG. 1 of the accompanying drawings. The release wavelength $\lambda_r$ will typically be in the range of 200-300 nm, for example KrF radiation at about 256 nm or XeCl radiation at about 308 nm, while the exposure wavelength $\lambda_e$ will typically be in the range of 400-1200 nm, for example mercury H line radiation at about 405 nm or G line radiation at about 436 nm. The wavelength, designated, $\lambda_{e*}$, at which the absorption of the flexible substrate falls to zero must of course be less than $\lambda_e$.

Figure 2A:
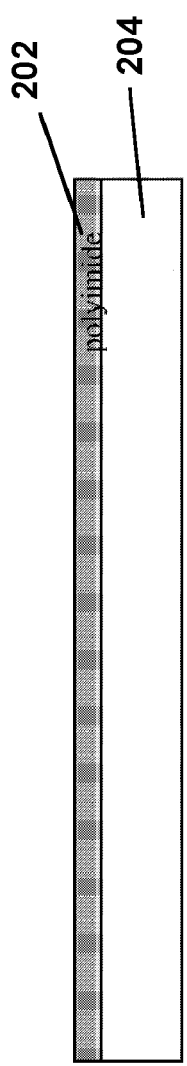
Figure 2B:
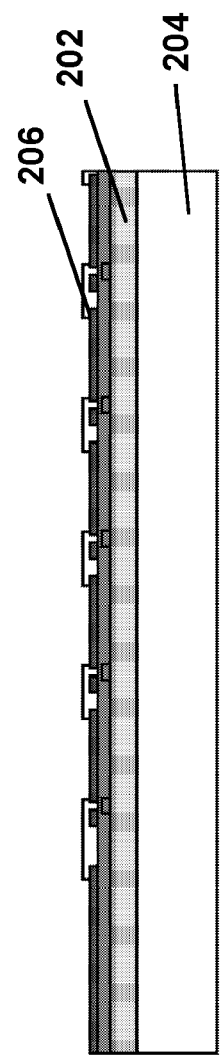
Figure 2C:
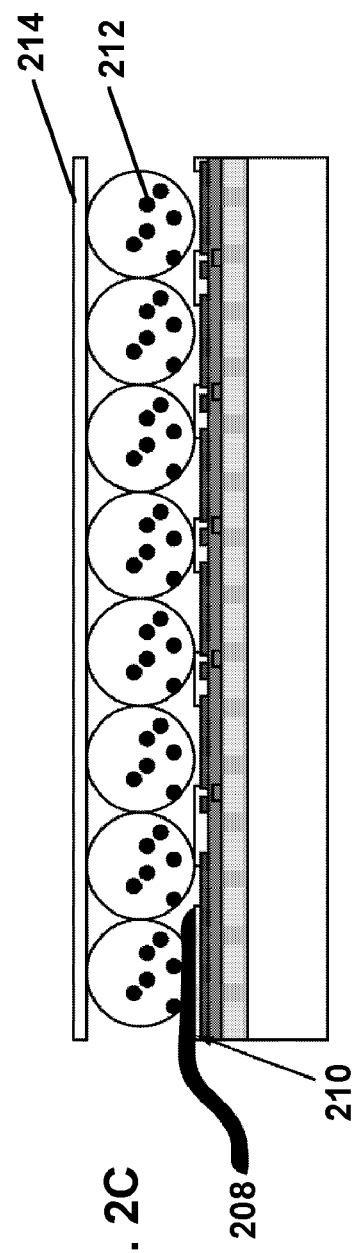

In the rigid carrier process of the present invention, after the flexible substrate has been secured to the carrier, a TFT array, or other non-linear elements may be formed on the flexible substrate using any standard process suitable for glass substrates. However, there are two principal variants of the rigid carrier process. In the first variant, illustrated in FIGS. 2A-2E, the flexible substrate (illustrated, for ease of illustration, as comprising only a single polymeric layer 202) is secured to the carrier 204 (FIG. 2A). TFT's, generally designated 206 (and shown as comprising only two layers although more layers may be present) and constituting backplanes for a plurality of separate electro-optic displays are formed on the secure flexible substrate 202, and the entire resultant structure is first diced to form individual backplanes, only one of which is shown in FIG. 2B. A tab interconnect 208 is bonded to each backplane via a conductive adhesive 210, and then a layer 212 of an electro-optic medium (shown in FIG. 2C as an encapsulated electrophoretic medium) is deposited on the tab-connected backplane. A front electrode 214, which will typically be carried on a second substrate (not shown) is provided on the opposed side of the layer 212 from the backplane to give the structure shown in FIG. 2C; at this point, the display may optionally be provided with a color filter array (not shown), typically adjacent the front electrode 214. In practice, the electro-optic medium is typically deposited on the front electrode and its associated substrate, and the resultant electro-optic medium/front electrode/substrate sub-assembly is laminated to the backplane to form the structure of FIG. 2C.

Figure 2D:
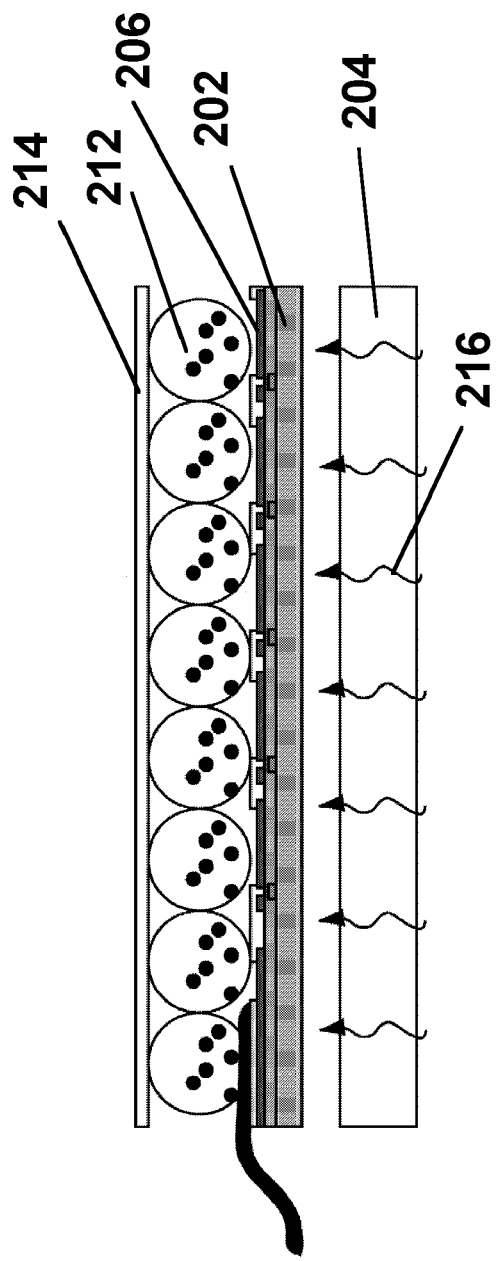
Figure 2E:
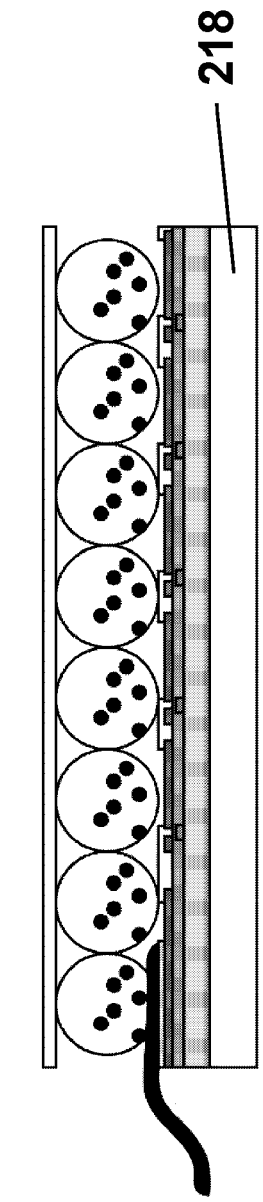

At this point, the display is essentially complete, and the last main stage in the process is separation of the display from the carrier 204. This is typically achieved by ablation at the interface between the carrier 204 and the substrate 202 (as shown in FIG. 2D) using radiation 216 which is directed through the carrier 204; the ablation is preferably laser ablation using for example an excimer laser. The ablation releases the completed flexible display. Prior to release from the carrier 204, additional structures may be laminated to the display medium, such as a color filter array and/or a protective cover. To provide additional mechanical support to the released display, a support layer 218 (typically a low cost flexible polymeric film such as PES or polycarbonate) may optionally be attached, preferably by lamination, to the surface of the flexible substrate 202 from which the carrier 204 has been separated. The support layer 208 can be a pre-formed layer, or may be provided by applying a precursor material (for example, dip coating an oligomer or pre-polymer solution) on to the relevant surface and curing to form the support layer. The support layer 218 provides added strength and protection to the final display.

A major advantage of this variant of the process is that the rigid carrier provides dimensional stability to the thin film array throughout the entire assembly process, thus allowing very fine alignment of a color filter array, and very fine alignment of tab interconnects to the thin film structures.

Figure 3D:
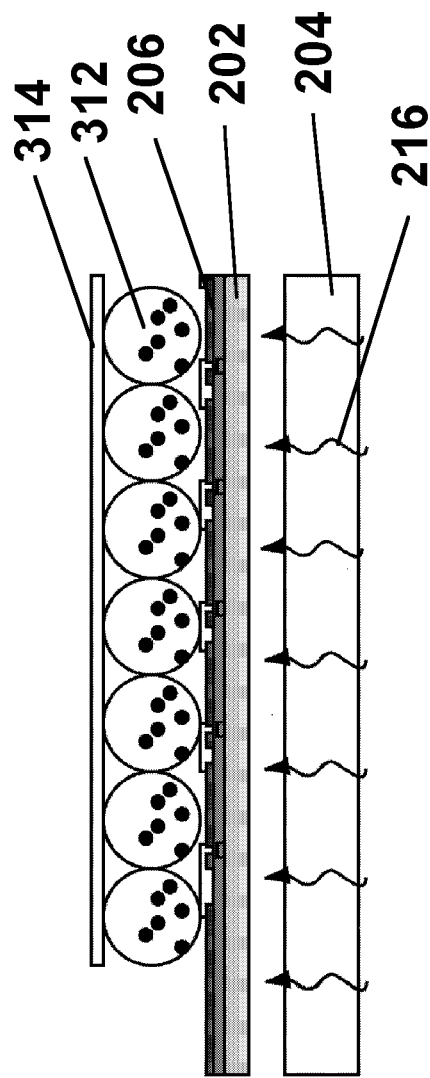
Figure 3E:
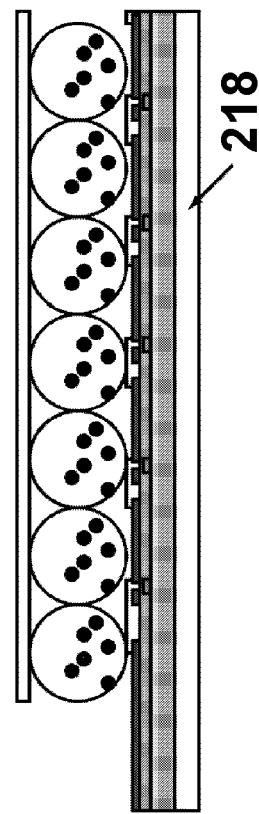
Figure 3F:
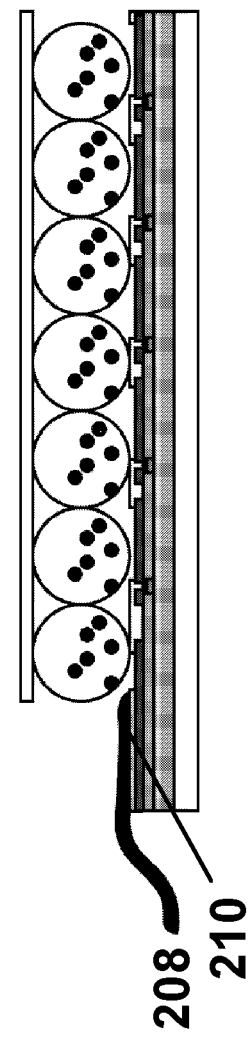

The second variant, illustrated in FIGS. 3A-3F, allows the rigid carrier to be reused. The steps illustrated in FIGS. 3A and 3B are identical to the corresponding steps shown in FIGS. 2A and 2B respectively. However, the remaining steps are different. Without prior dicing of the substrate 202 and carrier 204, the electro-optic medium 312 (preferably an encapsulated electrophoretic medium which may include a color filter array—not shown) and front electrode 314 are selectively bonded only to the active regions of the TFT arrays (FIG. 3C), then the carrier 204 is separated from the displays in the same way as previously described (FIG. 3D), and only then is the substrate 202 diced to provide individual displays (FIG. 3E) and tab interconnects attached via conductive adhesive 210 (FIG. 3F). Optionally, a support layer 218, formed in any of the ways previously described, may be attached after removal of the carrier 204, as illustrated in FIG. 3E.

In addition to allowing the rigid substrate to be reused, the process of FIGS. 3A-3F allows the electro-optic medium can be simultaneously deposited on many displays at once. This deposition may be effected by using a patterned electro-optic medium/front electrode/substrate sub-assembly which has holes where the tab bonds are needed. Such a process provides an improvement over conventional liquid display manufacturing, which requires each backplane to be packaged individually.

The present invention allows a flexible electro-optic display to be manufactured in an existing glass fab with virtually no changes to the facility. The fab could stay on-line and would be able to simultaneously produce flexible and glass-based backplanes. This invention side steps virtually all of the most difficult and costly issues associated with developing commercial flexible display manufacturing; i.e. fixturing, re-tooling, handling, contamination, substrate warp, surface roughness issues, surface defect issues, and substrate dimensional stability.

Figure 4A:
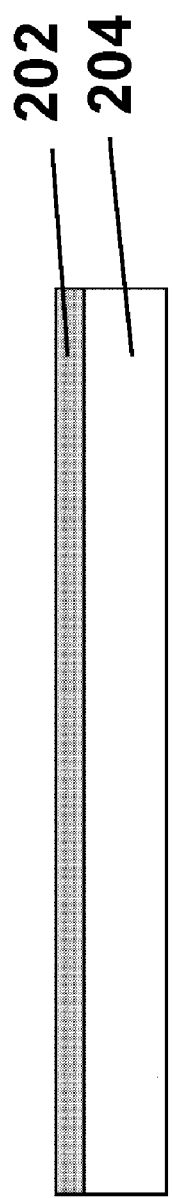
Figure 4B:
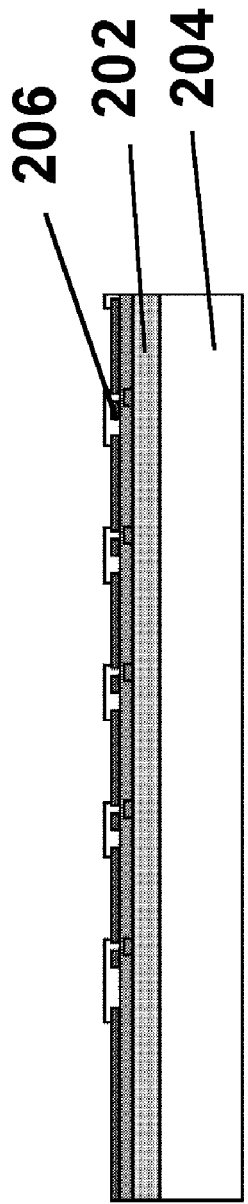

FIGS. 4A-4F illustrate another variant of the rigid carrier process of the invention; in this variant, the flexible substrate is separated from the rigid carrier before the electro-optic medium is applied to the flexible substrate. The process of FIGS. 4A-4F begins in the same way as the processes previously described, as illustrated in FIGS. 4A and 4B, which are identical to FIGS. 2A and 2B respectively.

Figure 4C:
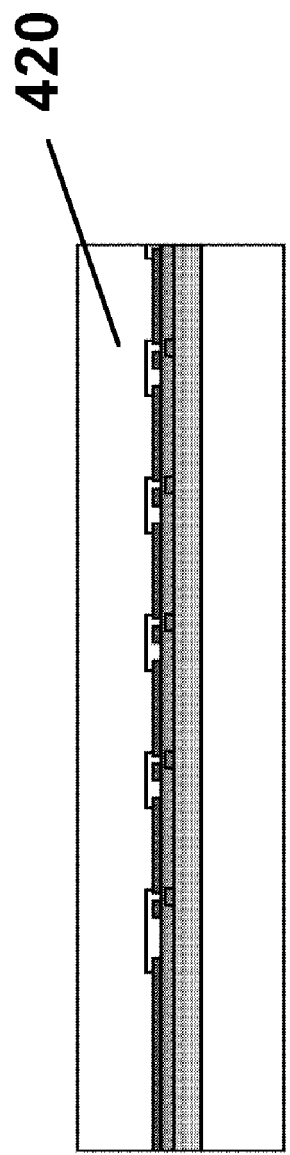
Figure 4D:
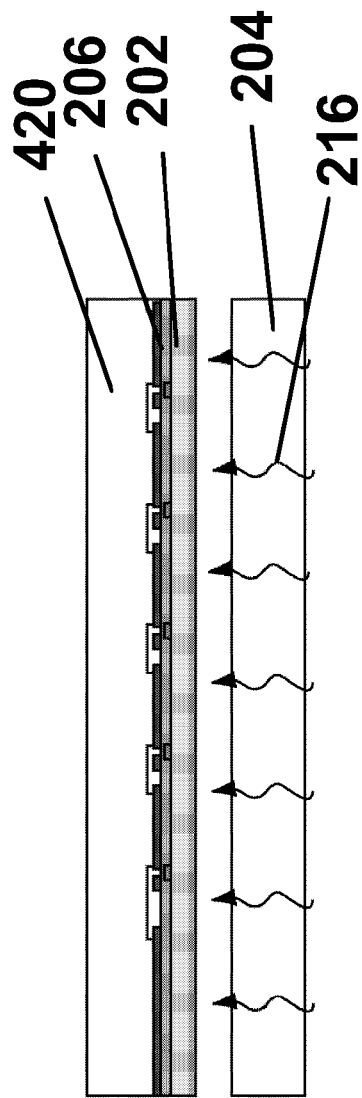
Figure 4E:
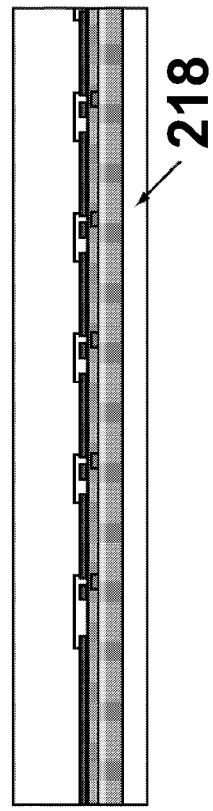
Figure 4F:
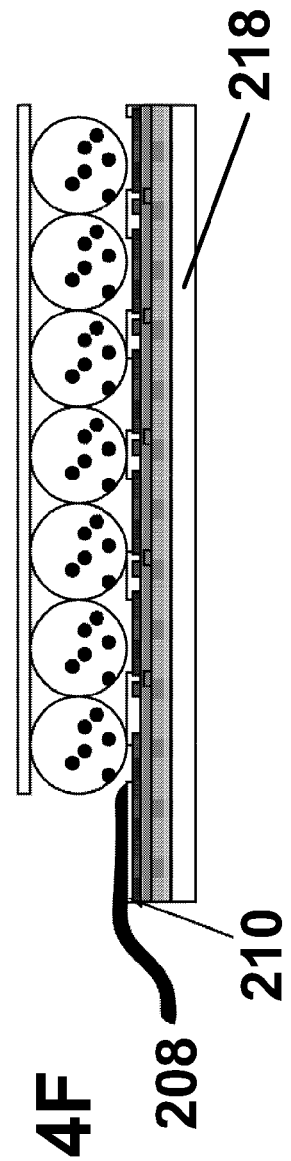

However, the subsequent steps in the process of FIGS. 4A-4F are different from those previously described. Following TFT fabrication, a transfer substrate 420 that has a tacky surface is adhered to the front surface (i.e., the surface remote from the carrier) of the TFT-carrying substrate (FIG. 4C). This transfer substrate 420 desirably has the following properties: 1) sufficient flexibility to be rolled on and peeled off repeatedly; 2) consistent and repeatable peel strength, high enough to support the flexible substrate for handling, but low enough so as to not damage the flexible substrate or TFT array upon peeling, 3) leaving no residue after peeling, 4) capable of being used numerous times, and 5) able to tolerate the lamination temperature required to permanently bond a flexible substrate to the backplane. An example of a suitable material is Gel-Film made by GelPak, LLC in Sunnyvale, Calif. The material is a specialized silicone based film laminated to a flexible PET backing material. After the transfer substrate 420 is attached, the substrate 202 is separated from the carrier 204 in the manner previously described (FIG. 4D). With the transfer substrate 420 attached, the substrate 202 and attached TFT array can easily be handled and stored with minimal risk of damage. The next step (FIG. 4E) is laminating a flexible support 218, of any of the types previously described to the surface of the substrate 202 from which the carrier 204 was removed. If the flexible substrate itself has sufficient strength and mechanical integrity, this step may not be necessary. Next (FIG. 4F), the substrate is diced to produce individual backplanes; just prior to this dicing, the transfer substrate 420 layer is peeled from the substrate 202. For a display application, the display medium 212, front electrode 214 and tab interconnect 208 are then attached.

It will be apparent to those skilled in the relevant arts that the preferred rigid carrier processes described above make major demands upon the techniques used for fixturing flexible substrates during TFT backplane fabrication. Ideally, existing TFT manufacturing equipment will be able to handle the fixtured substrate without modifications. This would allow flexible substrates to be processed in existing TFT fabs with minimal retrofitting which will accelerate the commercialization of flexible displays. There are described below several different approaches: to bonding, welding and physical techniques, laser release, post-process thinning, and magnetic fixturing.

For all fixturing schemes it is important that the fixtured substrate match traditional glass substrates in terms of weight, thickness, and mechanical properties such as sag. Deviation from "glass specifications" is likely to require significant modifications to existing TFT fabrication facilities.

Figure 5D:
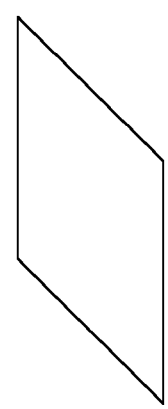
FIGS. 5A-5D illustrate various types of rigid carriers which may be used in rigid carrier processes of the present invention.
Figure 5C:
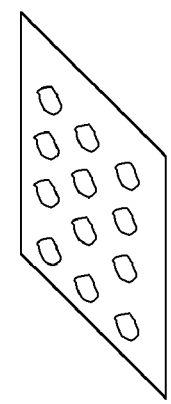
Figure 5B:
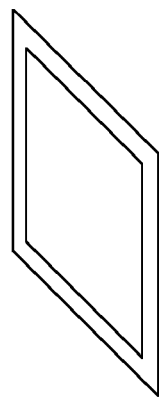
Figure 5A:
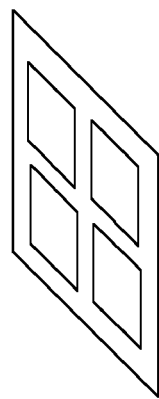

In one fixturing approach, the substrate is bonded to a carrier using either an organic or inorganic bonding layer. The carrier may be a solid sheet of material as shown in FIG. 5A, a partial sheet of material as shown in FIG. 5B, or a frame as shown in FIGS. 5C and 5D. Useful carrier materials include stainless steel, glass, metals, plastics, and ceramics.

Figure 6:
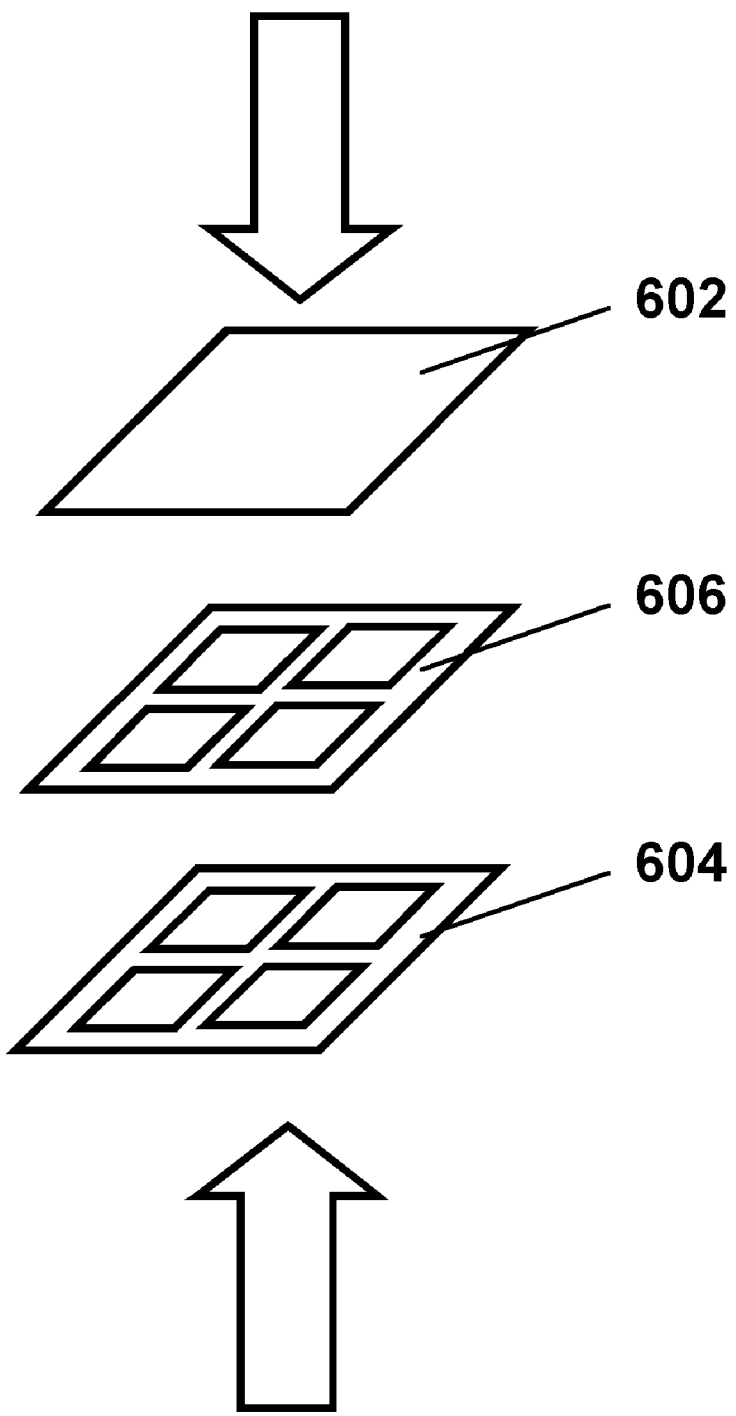
FIG. 6 illustrates a preferred method for bonding a substrate to a carrier in a rigid carrier process of the present invention.

It is desirable for the coefficient of thermal expansion (CTE) of the carrier to be equal to or slightly larger than the CTE of the substrate. If the CTE of the carrier and substrate are equal, there will not be any stress during thermal cycling and, in the case of a frame, the tension of the substrate will be maintained during thermal cycling. If the CTE of the carrier is slightly larger than the CTE of the substrate, the substrate will be under tension during thermal cycling, which will prevent the substrate from sagging. Another requirement (if heat is used to form the bond between the carrier and the substrate) is that the bond temperature exceed the process temperature ($T_{bond} >> T_{process}$) so that the bond remains intact during processing. Bonding can be performed by applying bond material to either the carrier or the substrate, or by using sheet of bonding material (for example, a sheet of indium or a pre-formed epoxy sheet), and using heat and/or pressure to form the bond. FIG. 6 illustrates the bonding of a flexible substrate 602 to a frame-type rigid carrier 604 using a pre-patterned sheet 606 of bonding material. Examples of materials useful in the bonding layer include aluminum, indium and other solders, and high temperature epoxy.

Figure 7:
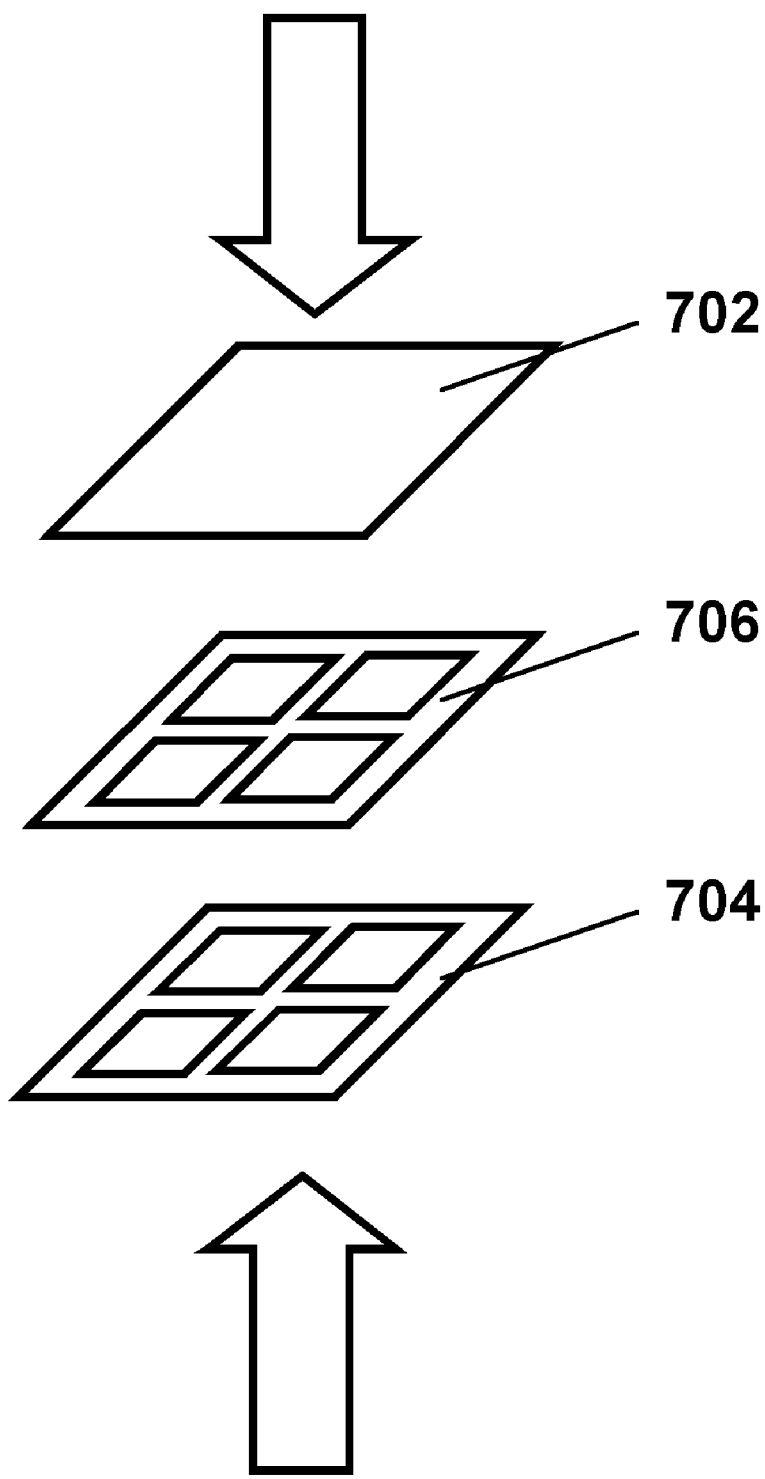
FIG. 7 illustrates a second preferred method for bonding a substrate to a carrier in a rigid carrier process of the present invention.

One preferred embodiment of the method shown in FIG. 6 is illustrated in FIG. 7. In this preferred embodiment, a stainless steel substrate 702 is used with a pre-patterned sheet 706 of aluminum as the bonding material and a stainless steel frame 704 as the carrier, this frame is arranged, by engineering of its steel composition, to have a CTE slightly greater than that of the stainless steel substrate. Bonding is effected at approximately 650° C. under pressure.

After TFT formation, the substrate may be released before display dicing or the displays may be diced without debonding the substrate, as described above with reference to FIGS. 2 to 4. In both cases, it is preferable to clean the frame and reuse it. Debonding may be performed by any convenient method, for example elevated temperature, chemical etching, or ultraviolet exposure.

Figure 8:
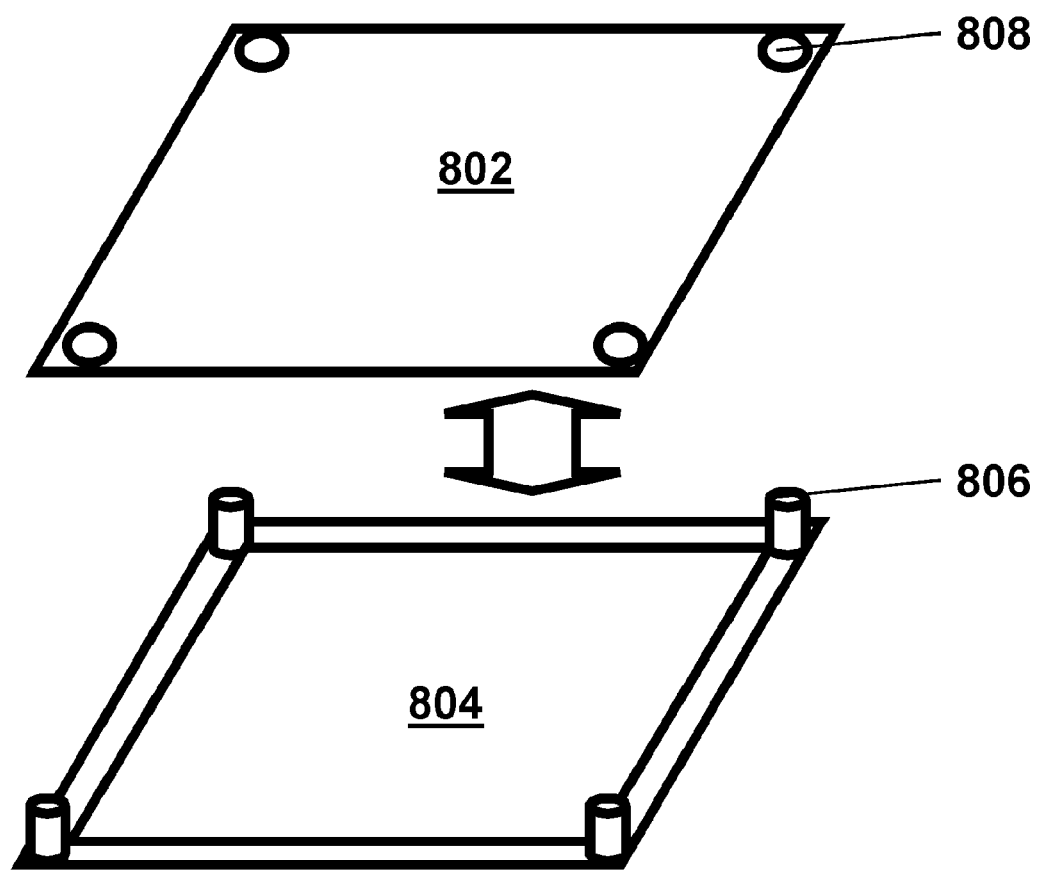
FIG. 8 illustrates a peg and hole scheme which may be used for securing a flexible substrate to a substantially rigid carrier in a rigid carrier process of the present invention.
Figure 9:
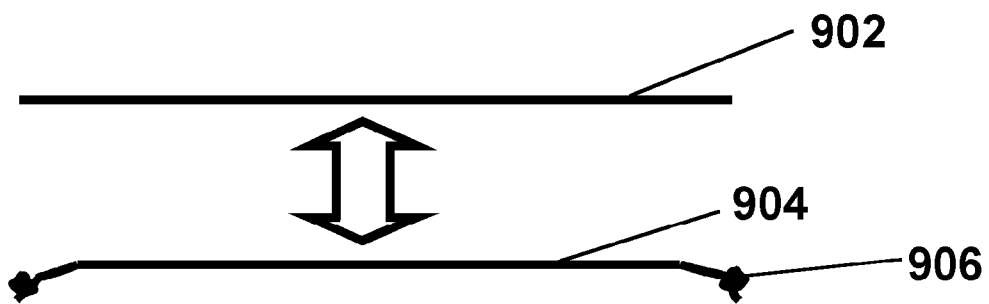
FIG. 9 illustrates an alternative form of peg and hole scheme which may be used for securing a flexible substrate to a substantially rigid carrier in a rigid carrier process of the present invention.

The substrate may also be secured to the rigid carrier by welding and other physical techniques. This approach is similar to the bonding approach previously described except that the substrate is spot-welded to the carrier or is physically held thereby. FIG. 8 shows one example of a carrier 804 that physically holds a substrate 802. The carrier 804 is provided with four upstanding projections 806 and the substrate 802 is provided with corresponding apertures 808 which can be receive these projections 806. This carrier 804 may also be used to tension the substrate 802 if the apertures 808 in the substrate 802 are arranged slightly closer together than the projections 806 on the carrier 804. Any convenient form of fastener could also be used in the place of the projections/apertures arrangement. Note that in the specific embodiment shown in FIG. 8, the projections 806 will extend above the plane of the substrate 802, and the resultant protrusion may cause problems during processing. Liquid could also get trapped in the fixturing mechanism or between the substrate and carrier. The alternative embodiment shown in FIG. 9 (in which projections 906 extend diagonally upwardly from the edges of a domed carrier 904, and can be inserted into apertures (not shown) provided in the peripheral portions of a substrate 902, these peripheral portions being bent downwardly over the edges of the domed carrier 904) does not have any part of the fixture extending above the plane of the substrate 902, and may thus be preferred.

If the substrate is spot-welded to the carrier, the substrate could be diced to produce individual displays without separating it from the carrier. If the substrate is clamped to the carrier or otherwise physically secured, the substrate would normally be removed from the carrier prior to the dicing step.

Figure 10A:
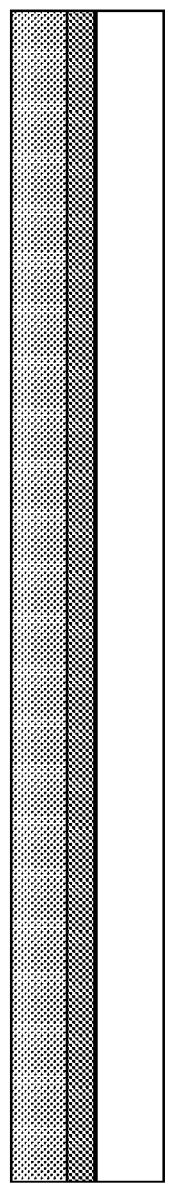
FIGS. 10A and 10B illustrate two different stages in a preferred delamination step for use in a rigid carrier process of the present invention.
Figure 10B:
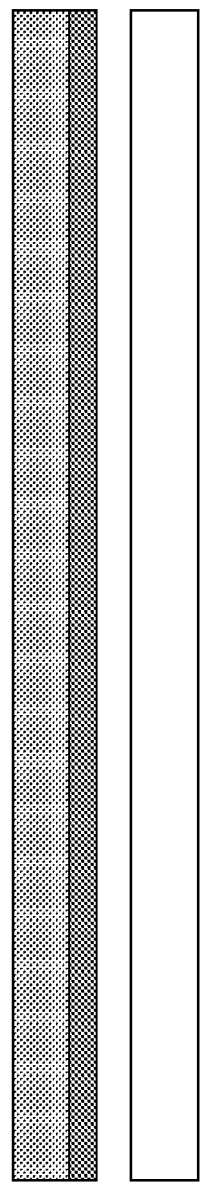

Various methods may be used to release the substrate from the carrier in the rigid carrier process. Laser release has already been described above with reference to FIGS. 2 to 4. In the further embodiment shown in FIGS. 10A and 10B, an adhesive layer 1006, typically of polyimide or other polymer, is used to secure a steel (or other metal) substrate 1002 to a glass or other rigid carrier 1004. TFT's (not shown) are formed on the exposed surface (the upper surface in FIG. 10) of the steel substrate 1002 using the techniques described above and below, and thereafter the steel substrate 1002 is separated from the carrier 1004 by application of radiation through the carrier, as illustrated in FIG. 10B. This process maintains the mechanical advantages of a steel substrate (as opposed to attempting to handle an extremely fragile polymer foil separate from a steel substrate).

Delamination can also be accomplished using a wet chemical process if the adhesive layer is soluble in the chemical. This technique desirably requires a method for delivering the chemical over the entire area rather than just at the edges. One approach is to machine holes or channels in the carrier to assist with chemical delivery. Another option is to use a porous substrate material or a porous bonding material to assist with chemical delivery.

Another technique for separating the substrate from the carrier is to use heat (a temperature close to the glass transition temperature of the adhesive layer) to weaken the adhesive-carrier interface. The substrate could then be peeled from the carrier. A precision tool (such as a wedge) could also be used to separate the substrate from the carrier.

Since stainless steel substrates are magnetic or magnetizable, they can be transported and fixtured during the TFT fabrication process by the use of magnets.

The rigid carrier process of the invention may be carried out by forming the TFT's on a thick, semi-rigid material, for example a polymer, and then back-lapping or thinning the substrate after TFT formation. Such thinning could be effected before or after separation of the individual displays from the process sheet.

Process for Forming Transistors with Reduced Number of Patterning Steps

For low-cost and simplified manufacturing, it is advantageous to reduce the number of process steps in the TFT fabrication process. This is especially true for flexible TFT backplanes because of the substrate handling challenges and the potential for yield loss during handling and processing. For example, in a roll-to-roll manufacturing process for TFT's on flexible substrates, reducing the number of process steps will reduce the number of times that the roll has to be wound and unwound and the number times that the substrate contacts the rollers. This will improve yields.

This invention provides a process for forming a transistor array on an insulating substrate; this process may use only three mask steps.

Figure 11:
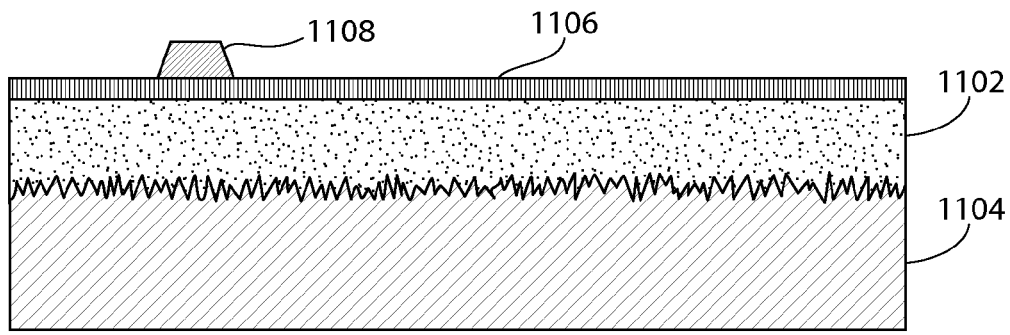
FIGS. 11 to 15 are schematic cross-sections through a substrate and transistor at various stages during a process of the present invention for formation of the transistor.
Figure 12:
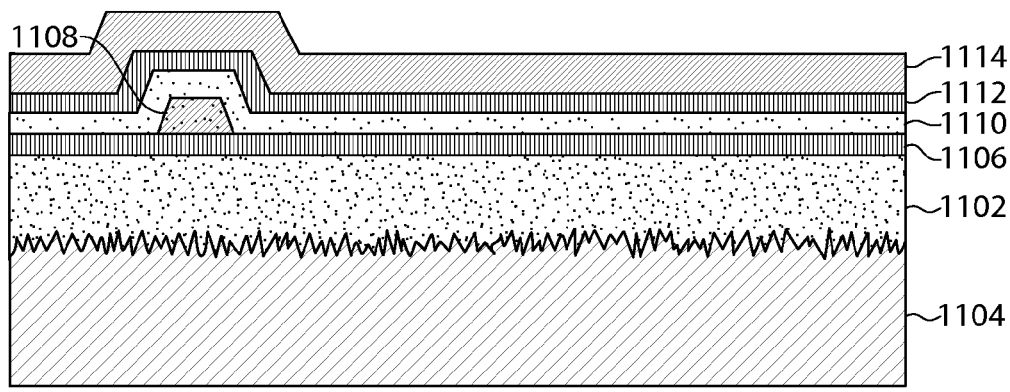
Figure 13:
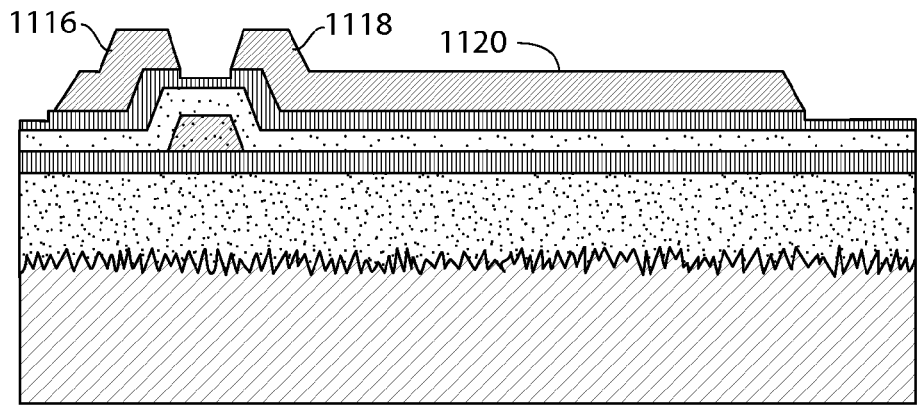

In the first step of a preferred form of this process, illustrated in FIG. 11, an insulating layer substrate is provided. A preferred substrate is preferred by depositing an insulating layer 1102, for example of polyimide (see the aforementioned 2002/0019081) is deposited on to a steel or similar foil 1104 and a passivating layer 1106, for example of silicon nitride, is deposited over the insulating layer 1104. A first metal layer is coated over the passivating layer 1106 and patterned to form a gate electrode 1108. Next, as shown in FIG. 12, there are successively deposited a gate dielectric layer 1110, typically of silicon nitride, a semiconductor layer 1112 (preferably comprising a layer of amorphous silicon, $\alpha$-Si, followed by a layer of n-doped amorphous silicon, n+$\alpha$-Si), and a second metal layer 1114. The resultant structure is then etched, preferably by reactive ion etching (RIE) through the full thickness of the second metal layer 1114 and part way through the semiconductor layer 1112 (preferably using a time etch which etches through the n+$\alpha$-Si layer but not through the underlying $\alpha$-Si layer; it is of course essential that this $\alpha$-Si layer remain within the channel region of the transistor), to produce the structure shown in FIG. 13, in which the large remaining portion of the second metal layer forms both the source 1116 and drain electrodes 1118 of the transistor and the pixel electrode 1120 which will, in the final form of the display in which the transistor is intended to be used, lie adjacent an electro-optic medium (not shown).

Figure 14:
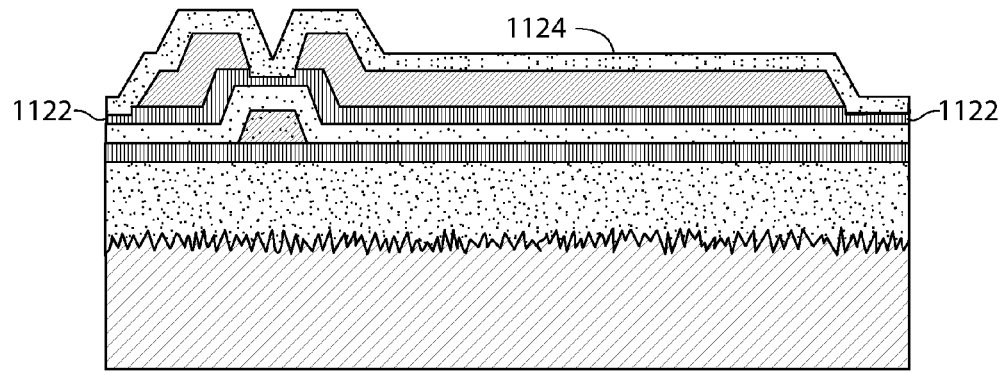

At this point, the semiconductor layer 1112 is continuous between adjacent transistors and thus, as indicated in FIG. 14, provides a leakage path 1122 between adjacent transistors. To remove this leakage path 1122, a second passivating layer 1124, preferably of silicon nitride, is deposited over the whole surface of the substrate to produce the structure shown in FIG. 14, and thereafter a layer of photoresist (or other etch-resistant material, for example polyimide) is applied and patterned so that the remaining portion 1126 (FIG. 15) of the photoresist covers the portions of the second passivating layer 1124 overlying the source 1116 and drain 1118 electrodes. Finally, the assembly is subjected to a second etching step, again preferably using reactive ion etching, to produce the structure shown in FIG. 15; note that this second etching step uses both the photoresist 1126 and the pixel electrode 1120 as a mask, and etches completely through the semiconductor layer 1112, thus closing the leakage path 1122 through this layer and completely isolating adjacent transistors from each other. Although the second etching step is illustrated in FIG. 15 as etching completely through the gate dielectric layer 1110, those skilled in the art of fabricating TFT's will appreciate that this is not strictly necessary and that none, part or all of the thickness of the gate dielectric layer 1110 may be removed during this second etching step.

Figure 15:
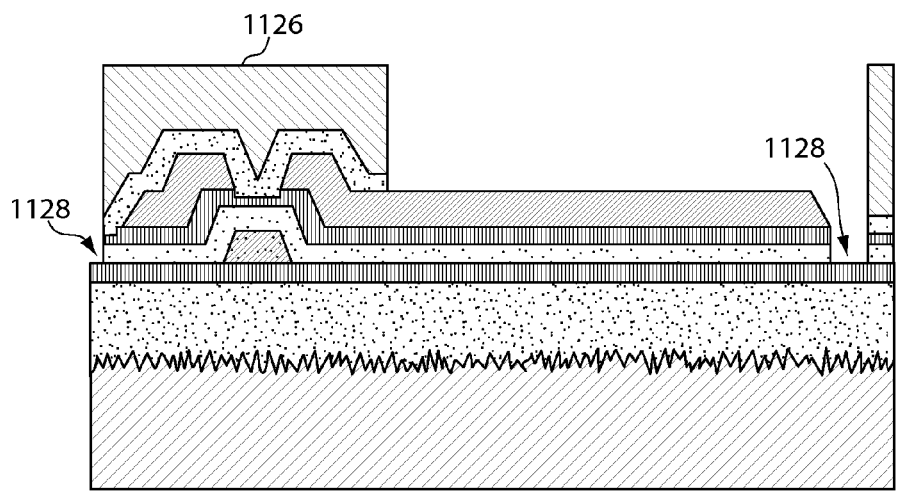

The photoresist 1126 or other etch-resistant material shown in FIG. 15 may be removed, or allowed to remain to act as a light shield to reduce light-induced leakage through the channel region of the TFT.

Figure 16:
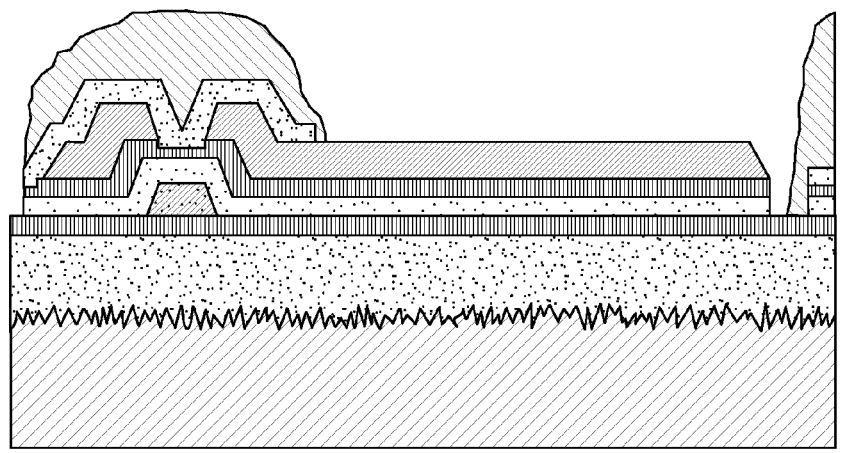
FIGS. 16 and 17 are schematic cross-sections, similar to those of FIGS. 11 to 15, illustrating two optional additional steps in the process illustrated in FIGS. 11 to 15.
Figure 17:
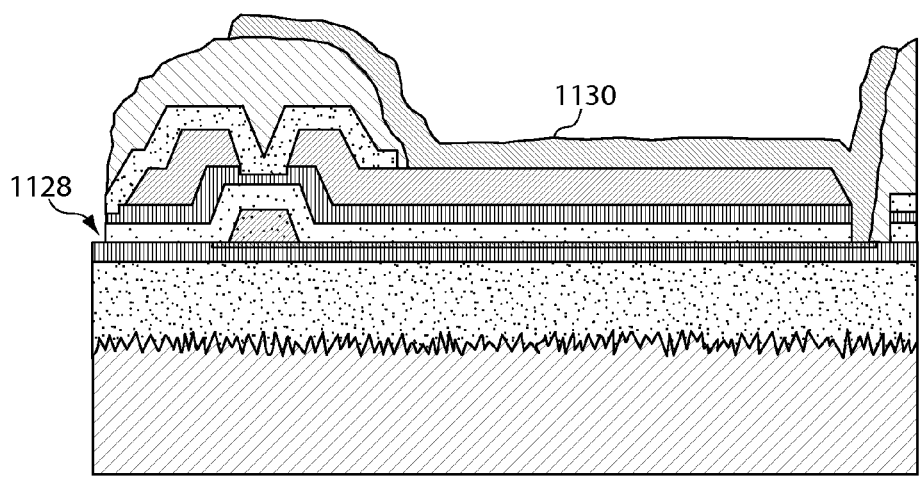
Figure 18A:
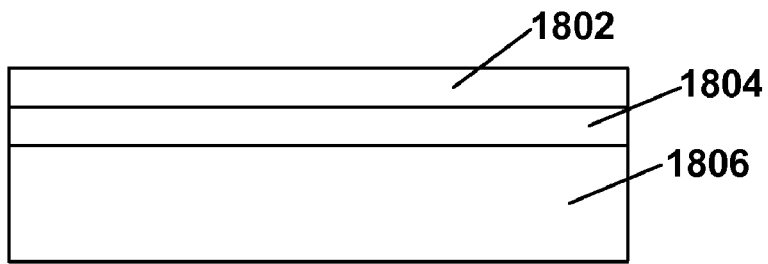
FIGS. 18A to 18D are schematic side elevations showing various stages of a process of the present invention for formation of a diode on a substrate.
Figure 18B:
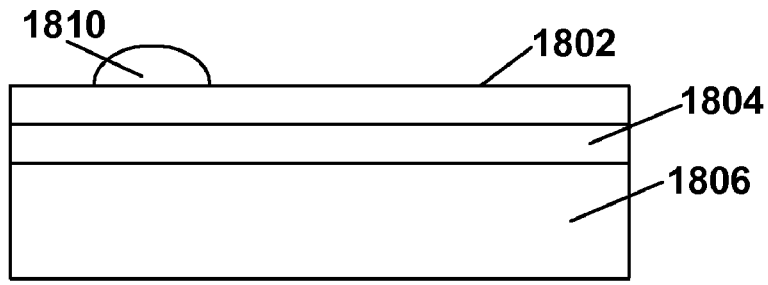
Figure 18C:
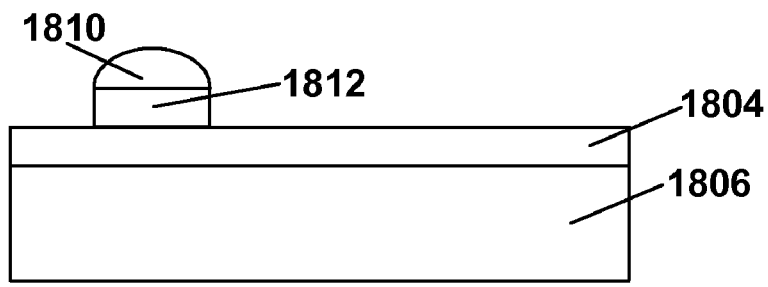
Figure 18D:
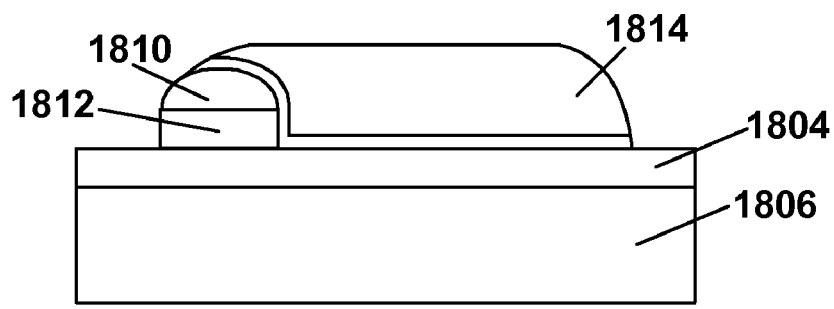
Figure 19:
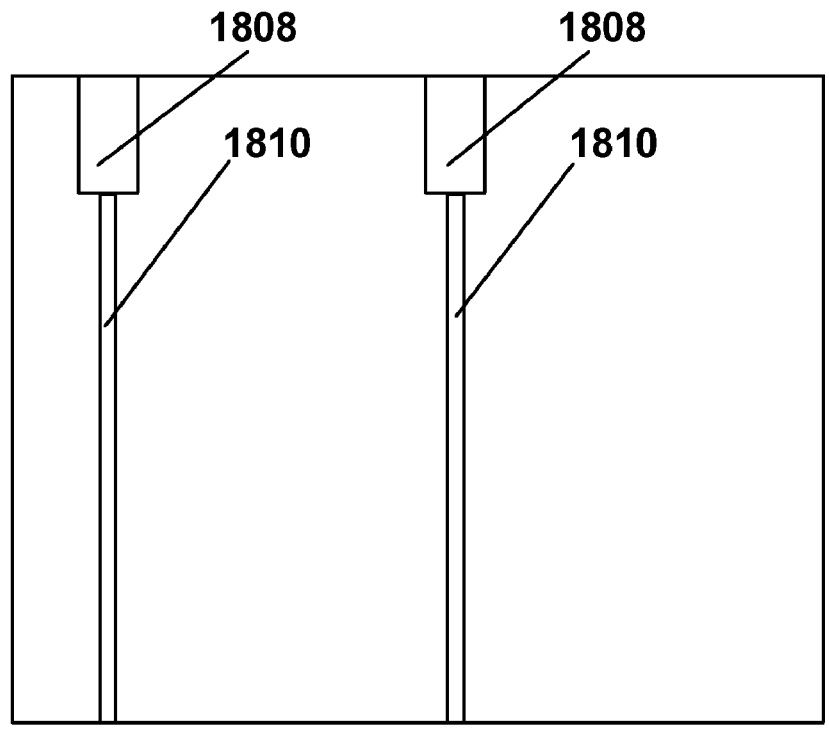
FIGS. 19 and 20 are schematic top plan views corresponding to the side elevations of FIGS. 18B and 18D respectively.
Figure 20:
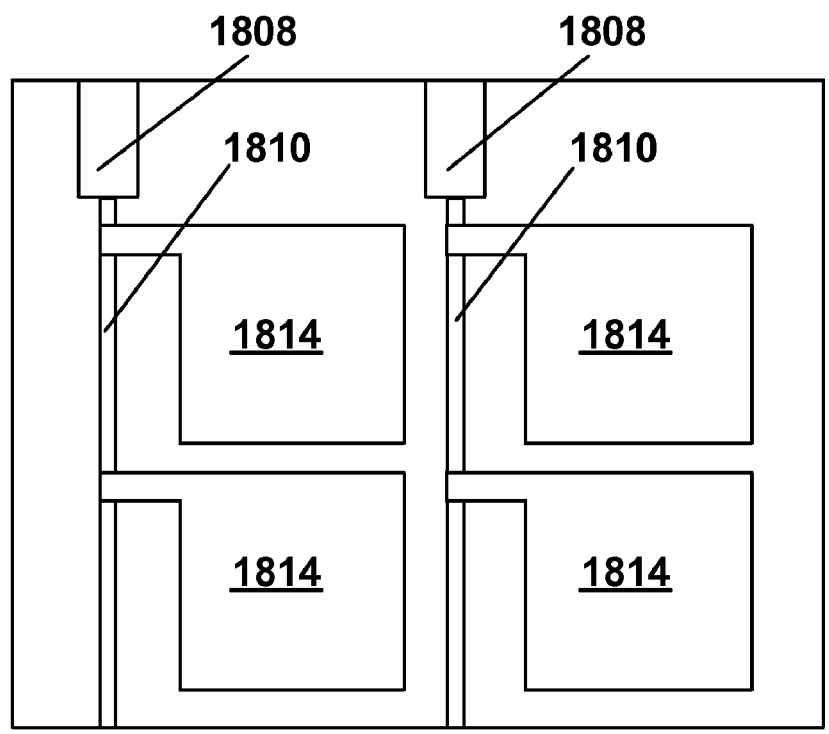

FIGS. 16 and 17 illustrate two optional additional steps in the process. The photoresist may be reflowed by heating as shown in FIG. 16 so that it flows into the gaps 1128 (FIG. 15) provided by the preceding etching step. Also, following such reflowing, a further layer of conductive material 1130 (FIG. 17), which may be a metal or a conductive polymer may be formed on top of the original pixel electrode 1120, and this additional conductive layer can extend over the transistor, thus providing a "buried transistor" design.

In a variant of the process, contact pads may be formed on the substrate at the same time as, but spaced from, the gate electrodes 1108, these contact pads being positioned such that the final etching step exposes the contact pads, thus rendering them available for connection to other parts of the overall display. Also, in another variant of the process, the second passivating layer 1124 may be omitted.

This process of this invention achieves a patterned semiconductor layer without an additional mask step and thus, as compared with prior art processes which do not pattern the semiconductor layer, reduces the degradation of performance caused by leakage through an unpatterned semiconductor layer when the transistor array is in use.

Diodes with Printed Components

As already indicated, the cost of backplanes may be significantly reduced by replacing photolithography with printing, and this aspect of the present invention relates to incorporating printing into the manufacture of diode matrix backplanes. Printing may be incorporated into electro-optic (especially encapsulated electrophoretic) displays because the electro-optic medium does not require a planar surface, in contrast to liquid crystal displays, which require tight control of cell gaps on the order of 5-10 μm. Printed films are usually on the order of 5-25 μm so printing is not suitable for liquid crystal displays. The performance of printed devices is typically worse than the performance of devices fabricated using standard techniques (photolithography for example). Compared to other display technologies, encapsulated electrophoretic and some other electro-optic media do not require high drive current and may be able to tolerate the lower performance.

Metal-insulator metal (MIM) diodes are commonly used for active matrix backplanes. The insulator is typically formed by anodizing a patterned metal film. To make electrical contact to an anodized metal film, a contact hole is formed using photolithography and etching. To avoid this photolithography step, a conductive material such as carbon ink may be screen-printed onto the metal prior to anodization. The printed material should be resistant to anodization. This invention provides a diode array in which a conductive material is printed on a metal film to eliminate the need for a contact hole later in the process. Applicable printing processes include screen, ink-jet, offset, intaglio, gravure, and flexographic (or any combination of these techniques). Applicable materials include, but are not limited to, composite materials (screen-printing inks) and organic conductors.

The diode fabrication process may also be simplified by using a printed dielectric as an etch mask. The printed dielectric may remain on the device for isolation and capacitance reduction. This invention provides a process for forming a diode on a substrate; in this process, a printed dielectric is used as an etch mask. Applicable materials include both organic and inorganic dielectrics, as well as organic/inorganic composites.

The diode fabrication process may also be simplified by printing one of the electrodes of the diode or the pixel electrode. In some structures, the top electrode and pixel electrode may be printed at the same time. To achieve good diode performance, the electrode may consist of a multilayer stack. In this case, the conductive material would be printed onto a thin metal film which provides a high quality interface to the diode. The printed material would serve as a mask for etching the thin metal film. This invention provides a diode structure in which an electrode can be printed using a conductive material.

To improve the optical performance of a display, it may be desirable to bury the diode and select lines under a printed dielectric. The pixel electrode (which may also be printed) would be tied to the diode through a via in the dielectric. This structure ensures that the electronic ink is only driven by the pixel electrode. Again, a printed dielectric is not practical for liquid crystal displays because of the thickness of printed materials. Using standard processes (photolithography and etching) to achieve a buried structure adds cost and complexity which defeats the purpose of using diodes in the first place (low cost, simplified fabrication). This invention provides a diode structure in which the diode can be buried using a printed dielectric and printed pixel electrode.

FIGS. 18A-18D, 19 and 20 of the accompanying drawings illustrate a preferred process of the present invention for formation of diodes. In the first step shown in FIG. 18A, a metal layer 1802 is deposited over an insulating substrate, which may be of the polyimide-over-steel type described above and comprise a polyimide layer 1804 formed on a steel substrate 1806. Next, as shown in side elevation in FIG. 18B and in top plan view in FIG. 19, a conductive material 1808 is printed in pad regions and a dielectric material 1810 is printed in a line pattern. The next step of the process, shown in FIG. 18C, etches the metal layer 1802 using the dielectric 1810 and conductive materials 1808 as a mask, and then anodizes the side walls of the resultant metal strips 1812. Finally, as shown in side elevation in FIG. 18D and in top plan view in FIG. 20, a further (optional) metal layer is deposited, a conductive material is printed in the pattern required for pixel electrodes 1814, and the metal layer (if present) is etched using the printed conductive material as a mask.

Figure 21:
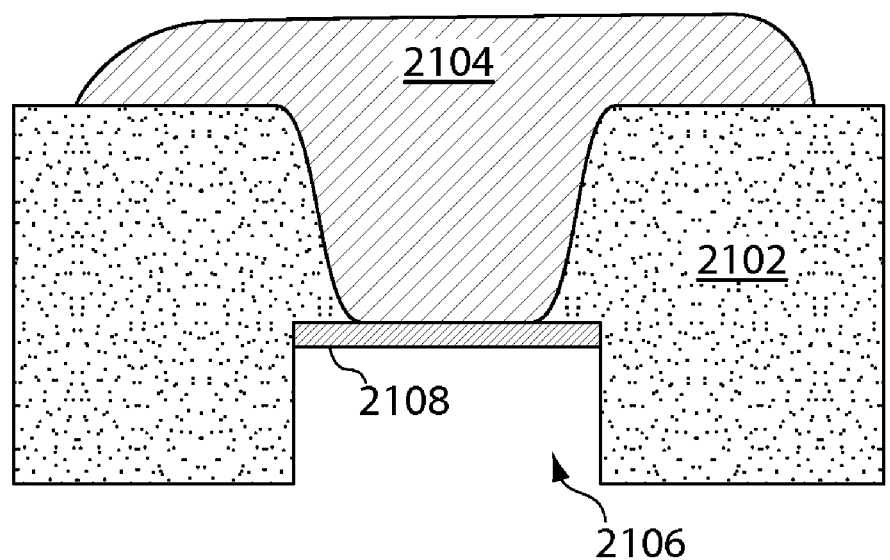
FIG. 21 is a schematic section through a second form of diode produced by a process of the present invention.

FIG. 21 of the accompanying drawings illustrates one way in which a printed dielectric 2102 and a printed pixel electrode 2104 may be used with a diode 2106 having a top electrode 2108 to provide a buried diode structure.

Process for Driving Impulse-sensitive Electro-optic Display

As already indicated, and as discussed in more detail in the aforementioned copending application Ser. No. 10/065,795, many electro-optic displays (notably electrophoretic, rotating bichromal member and electrochromic displays) respond not solely to applied voltage, but the product of voltage and time (current or impulse). One manner of achieving intermediate optical states is to modulate the impulse seen by the display by using discrete voltage values, time values, or a combination of both. The data drivers (also called column drivers)

required to provide these many impulse levels can be expensive, especially if they require high voltages, and the cost increases with the number of voltage/time steps required. In order to minimize display cost for high voltage drivers with voltage modulation capability, it is advantageous to concentrate the voltage levels in the region where they most effectively allow the electro-optic effect of the display to be controlled via impulse modulation.

One method of maximizing access to small voltage steps while maintaining high voltage resolution between steps is to provide a band of voltage steps with an offset. For example, one could have 64 levels of voltage available, but instead of having those levels from 0-5V, one could have them from 10-15V. The problem is that for a given number of voltage levels and time steps, there are a finite mesh of voltage-time values that can be achieved. If there are desired optical states that cannot be addressed with these values, then those states cannot be displayed.

This invention provides additional voltage-time states that allow access to "forbidden" states described above. The invention is described by means of the following example.

Assume that we have four voltage states (2 bit) and four time states, which allow 16 total voltage-time values shown in the table below.

|   |    | time (s) |     |     |     |
|---|----|----------|-----|-----|-----|
|   |    | 0.1      | 0.2 | 0.3 | 0.4 |
| voltage | 10 | 1.0 | 2.0 | 3.0 | 4.0 |
| (v) | 11 | 1.1 | 2.2 | 3.3 | 4.4 |
|   | 12 | 1.2 | 2.4 | 3.6 | 4.8 |
|   | 13 | 1.3 | 2.6 | 3.9 | 5.2 |

In the above example the range of v-t values is from 1 volt-second to 5.2 volt seconds. If one requires a smaller (or larger) impulse, the values are not available. However if one adds in a discrete voltage value, one achieves four additional v-t states.

|   |    | time (s) |     |     |     |
|---|----|----------|-----|-----|-----|
|   |    | 0.1      | 0.2 | 0.3 | 0.4 |
| voltage (v) | 3 | 0.3 | 0.6 | 0.9 | 1.2 |
|   | 10 | 1.0 | 2.0 | 3.0 | 4.0 |
|   | 11 | 1.1 | 2.2 | 3.3 | 4.4 |
|   | 12 | 1.2 | 2.4 | 3.6 | 4.8 |
|   | 13 | 1.3 | 2.6 | 3.9 | 5.2 |

In the second table, a 3V value has been added, which allows v-t states from 0.3 to 5.2 volt-seconds. This can be repeated for additional discrete values, above or below the original v-t range.

The reference voltages may be formed from a resistor network.

This invention allows one to eliminate blind spots in the v-t matrix without the addition of more bits of voltage modulation, which is expensive. Instead, one creates a single additional state separated from the closely spaced voltage modulation group to fill in a series of values unreachable with the voltage modulation group alone.

Electrophoretic and other electro-optic materials require precise control of impulse values to achieve gray levels. Cost efficiency dictates that one cannot provide a continuous set of small steps from 0 to maximum switching voltage, but only use values near the maximum. However, this does not allow one to achieve all of the voltage levels needed for the display of 4-bit grayscale. This simple modification to the driver allows these states to be reached.

It will be apparent to those skilled in the art that numerous changes can be made in the specific embodiments of the present inventions already described without departing from the scope of the invention. Accordingly, the whole of the foregoing description is to be construed in an illustrative and not in a limitative sense.

The invention claimed is:

1. A method for forming a transistor array on a insulating substrate, the method comprising, in order:
   forming a plurality of gate electrodes on the substrate;
   depositing over said gate electrodes a dielectric layer, a semiconductor layer and a conductive layer;
   patterning said conductive layer to form adjacent each gate electrode a source and drain electrode pair separated by a channel region, said patterning also forming a pixel electrode for each source and drain electrode pair, said pixel electrode being electrically connected to one of the source and drain electrodes;
   covering said channel region of each transistor with an etch-resistant material; and
   etching the resultant structure using the etch-resistant material and the exposed portions of the conductive layer as a mask, said etching extending substantially through the semiconductor layer between adjacent transistors.

2. A method according to claim 1 wherein the substrate comprises a conductive foil covered by an insulating layer.

3. A method according to claim 2 wherein the substrated comprises a steel foil covered by a polyimide layer.

4. A method according to claim 1 further comprising forming a passivating layer on the substrate before the plurality of gate electrodes are formed thereon.

5. A method according to claim 1 wherein the semiconductor layer comprises a layer of amorphous silicon and a layer of n-doped amorphous silicon.

6. A method according to claim 1 wherein the patterning of the conductive layer to form the source and drain electrodes is effected by reactive ion etching.

7. A method according to claim 1 wherein the patterning of the conductive layer to form the source and drain electrodes also removes part but not all of the thickness of the semiconductor layer in the channel region.

8. A method according to claim 7 wherein the semiconductor layer comprises a layer of amorphous silicon and a layer of n-doped amorphous silicon and wherein the patterning of the conductive layer to form the source and drain electrodes removes the n-doped amorphous silicon from the channel region.

9. A method according to claim 1 further comprising, after the patterning of the conductive layer to form the source and drain electrodes but before covering the channel region with the etch-resistant material, covering the channel region and the pixel electrode with a passivating layer.

10. A method according to claim 9 wherein the passivating layer comprises silicon nitride.

11. A method according to claim 1 wherein the etch-resistant material comprises at least one of a photoresist and a polyimide.

12. A method according to claim 1 wherein said etching of said resultant structure is effected by reactive ion etching.

13. A method according to claim 1 wherein said etching of said resultant structure extends completely through the semiconductor layer between adjacent transistors and through at least part of the dielectric layer.

14. A method according to claim 1 further comprising removing the etch-resistant materials after said etching of said resultant structure.

15. A method according to claim 1 wherein the etch-resistant material is flowable, and after said etching of said resultant structure, the etch-resistant material is exposed to conditions effective to cause the etch-resistant material to flow into the gaps between adjacent transistors produced by said etching of said resultant structure.

16. A method according to claim 15 wherein following the flowing of the etch-resistant material into the gaps, a further layer of conductive material is formed over pixel electrode and at least part of the transistor.

17. A transistor array on an insulating substrate produced by a method according to claim 1.

18. An electro-optic display comprising a transistor array according to claim 17 in combination with an electro-optic medium disposed adjacent the pixel electrodes and at least one electrode on the opposed side of the electro-optic medium from the pixel electrodes.

* * * * *